(12) United States Patent
Cho et al.

(10) Patent No.: US 11,322,499 B2
(45) Date of Patent: May 3, 2022

(54) SEMICONDUCTOR DEVICE INCLUDING STORAGE NODE ELECTRODE INCLUDING STEP AND METHOD OF MANUFACTURING THE SEMICONDUCTOR DEVICE

(71) Applicant: Samsung Electronics Co., Ltd., Suwon-si (KR)

(72) Inventors: Jaehwan Cho, Suwon-si (KR); Junghwan Oh, Yongin-si (KR); Sangho Lee, Hwaseong-si (KR); Junwon Lee, Asan-si (KR); Jinwoo Bae, Yongin-si (KR); Sunghee Han, Hwaseong-si (KR); Yoosang Hwang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 28 days.

(21) Appl. No.: 16/943,019

(22) Filed: Jul. 30, 2020

(65) Prior Publication Data
US 2021/0202490 A1 Jul. 1, 2021

(30) Foreign Application Priority Data
Dec. 31, 2019 (KR) .......... 10-2019-0179040

(51) Int. Cl.
*H01L 27/108* (2006.01)

(52) U.S. Cl.
CPC .. *H01L 27/10817* (2013.01); *H01L 27/10852* (2013.01)

(58) Field of Classification Search
CPC ......... H01L 27/10817; H01L 27/10852; H01L 27/10814; H01L 28/90; H01L 28/75; H01L 27/108; H01L 28/91; H01L 27/10805; H01L 27/10847
See application file for complete search history.

(56) References Cited

U.S. PATENT DOCUMENTS

| 8,334,556 B2 | 12/2012 | Lee et al. |
| 8,742,494 B2 | 6/2014 | Wu |
| 8,878,273 B2 | 11/2014 | Kim et al. |

(Continued)

FOREIGN PATENT DOCUMENTS

| KR | 2002-0072846 A | 9/2002 |
| KR | 2015/0104337 A | 9/2015 |
| KR | 101929478 B1 | 12/2018 |

*Primary Examiner* — Mohammed R Alam
(74) *Attorney, Agent, or Firm* — Harness, Dickey & Pierce, P.L.C.

(57) ABSTRACT

A semiconductor device may include a bottom sub-electrode on a substrate, a top sub-electrode on the bottom sub-electrode, a dielectric layer covering the bottom and top sub-electrodes, and a plate electrode on the dielectric layer. The top sub-electrode may include a step extending from a side surface thereof, which is adjacent to the bottom sub-electrode, to an inner portion of the top sub-electrode. The top sub-electrode may include a lower portion at a level that is lower than the step and an upper portion at a level which is higher than the step. A maximum width of the lower portion may be narrower than a minimum width of the upper portion. The maximum width of the lower portion may be narrower than a width of a top end of the bottom sub-electrode. The bottom sub-electrode may include a recess in a region adjacent to the top sub-electrode.

16 Claims, 22 Drawing Sheets

(56) References Cited

U.S. PATENT DOCUMENTS

| | | |
|---|---|---|
| 9,263,456 B2 | 2/2016 | Saino |
| 9,627,253 B2 | 4/2017 | Kim |
| 9,786,598 B2 | 10/2017 | Kim et al. |
| 2002/0149977 A1 | 10/2002 | Oh |
| 2004/0095832 A1 | 5/2004 | Oh |
| 2013/0288472 A1 | 10/2013 | Choi et al. |
| 2014/0117440 A1 | 5/2014 | Taniguchi |
| 2015/0255466 A1 | 9/2015 | Hwang et al. |
| 2016/0225710 A1 | 8/2016 | Hwang et al. |
| 2018/0040813 A1* | 2/2018 | Han .................. H01L 43/08 |

* cited by examiner

SEMICONDUCTOR DEVICE INCLUDING STORAGE NODE ELECTRODE INCLUDING STEP AND METHOD OF MANUFACTURING THE SEMICONDUCTOR DEVICE

CROSS-REFERENCE TO THE RELATED APPLICATION

This application claims priority from Korean Patent Application No. 10-2019-0179040, filed Dec. 31, 2019, in the Korean Intellectual Property Office, the disclosure of which is incorporated herein by reference in its entirety.

BACKGROUND

1. Field

Apparatuses and methods consistent with example embodiments relate to a semiconductor device including a storage node electrode including a step and/or a method of manufacturing the semiconductor device.

2. Description of Related Art

As semiconductor devices are increasing in degree of integration and are being miniaturized, capacitors of dynamic random access memory (DRAM) devices are increasing in aspect ratio so as to provide a high capacitance in a limited area. Therefore, double storage node electrode technology for vertically stacking storage node electrodes to increase a capacitance is being developed.

Semiconductor devices include a supporter pattern, and thus, support a storage node electrode having a high aspect ratio so as not to fall. However, in a double storage node electrode, when a top storage node electrode disposed at an upper portion is misaligned with respect to a bottom storage node electrode disposed at a lower portion, the top storage node electrode extends to an open region of the supporter pattern, an may cause a reliability error in capacitors. Also, a defective connection where the top storage node electrode contacts a plurality of bottom storage node electrodes may occur.

SUMMARY

Some example embodiments of inventive concepts are directed to a semiconductor device including a double storage node electrode with enhanced reliability.

In addition, some example embodiments of inventive concepts are directed to a method of manufacturing a semiconductor device including a double storage node electrode with enhanced reliability.

A semiconductor device according to an embodiment of inventive concepts may include a substrate, a bottom sub-electrode on the substrate, a top sub-electrode on the bottom sub-electrode, a dielectric layer covering the bottom sub-electrode and the top sub-electrode, and a plate electrode on the dielectric layer. A region of the bottom sub-electrode may include a recess. The top sub-electrode may include a step extending from a side surface thereof. The step of the top sub-electrode may be adjacent to the bottom sub-electrode and an inner portion of the top sub-electrode. The top sub-electrode may include a lower portion at a level lower than the step of the top sub-electrode and an upper portion at a level higher than the step of the top sub-electrode. A maximum width of the lower portion of the top sub-electrode may be narrower than a minimum width of the upper portion of the top sub-electrode. The maximum width of the lower portion of the top sub-electrode may be narrower than a width of a top end of the bottom sub-electrode. The top sub-electrode may be adjacent to the region of the bottom sub-electrode including the recess.

A semiconductor device according to an embodiment of inventive concepts may include a substrate, a storage node electrode on the substrate, a dielectric layer covering a surface of the storage node electrode, a plate electrode on the dielectric layer, and a supporter pattern covering a portion of a side surface of the storage node electrode. The storage node electrode may include a bottom sub-electrode and a top sub-electrode on the bottom sub-electrode. The top sub-electrode may include a step in a side surface thereof adjacent to the bottom sub-electrode. The bottom sub-electrode may include a recess in a side surface thereof adjacent to the top sub-electrode. The supporter pattern may include a lower supporter pattern contacting the recess of the bottom sub-electrode.

A method of manufacturing a semiconductor device may include forming a bottom sub-electrode on a substrate; forming a lower supporter pattern covering a portion of a side surface of the bottom sub-electrode; forming an etch stop layer covering a top surface of the lower supporter pattern and a top surface of the bottom sub-electrode, the etch stop layer including a filler part extending up to a level that is lower than a bottom end of the lower supporter pattern; forming a mold layer on the etch stop layer; planarizing the etch stop layer and the mold layer; forming a top mold structure on the etch stop layer; forming a top storage node electrode hole passing through the etch stop layer and the top mold structure, the top storage node electrode hole exposing the top surface of the bottom sub-electrode; forming a top sub-electrode filling the top storage node electrode hole, the top sub-electrode including a step extending in a direction toward an inner portion thereof; and removing the etch stop layer.

DETAILED DESCRIPTION

Figure 1:
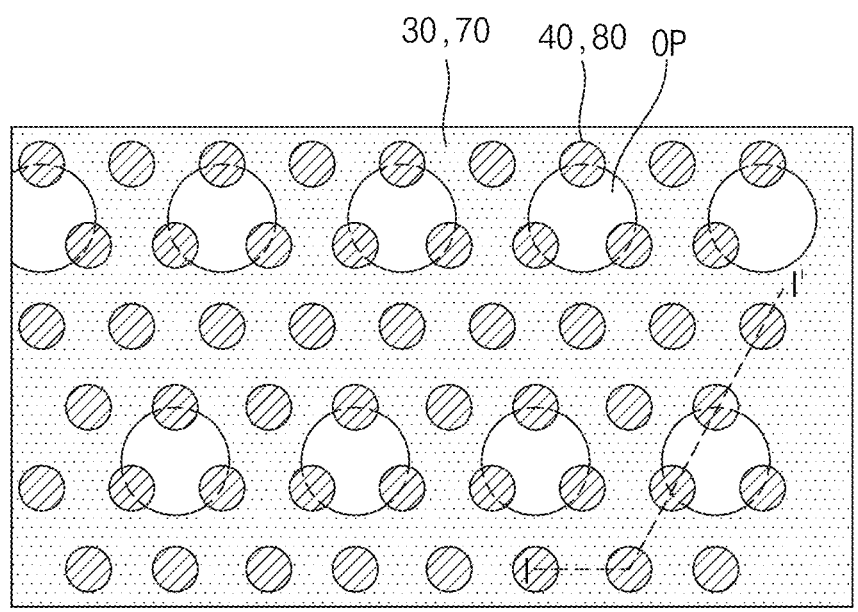
FIG. 1 is a plan view illustrating an upper supporter pattern 70 and storage node electrodes 40 and 80 of a semiconductor device according to an embodiment.
Figure 2:
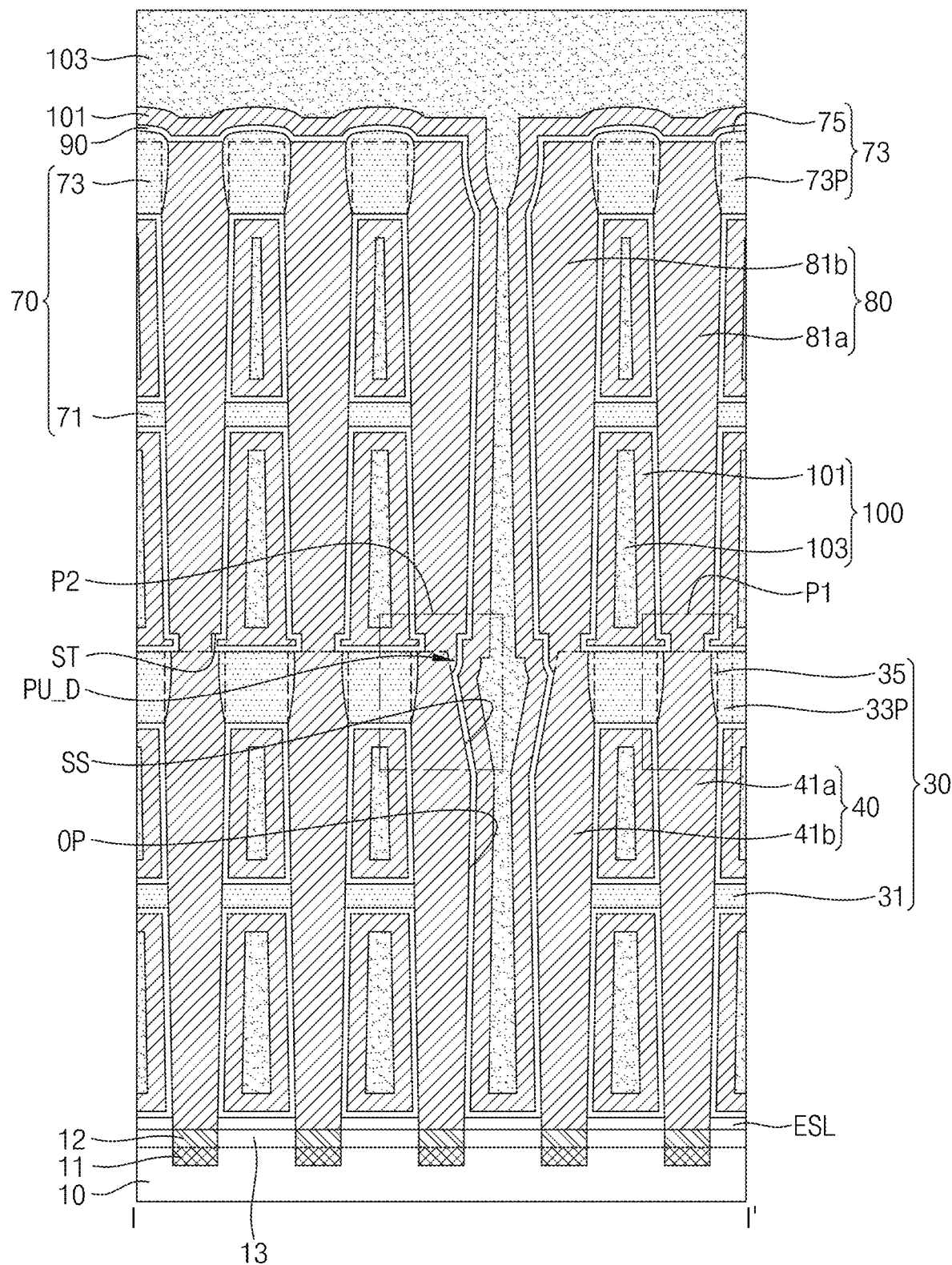
FIG. 2 is a vertical cross-sectional view taken along line I-I' of FIG. 1 for schematically illustrating the semiconductor device according to an embodiment.
Figure 3A:
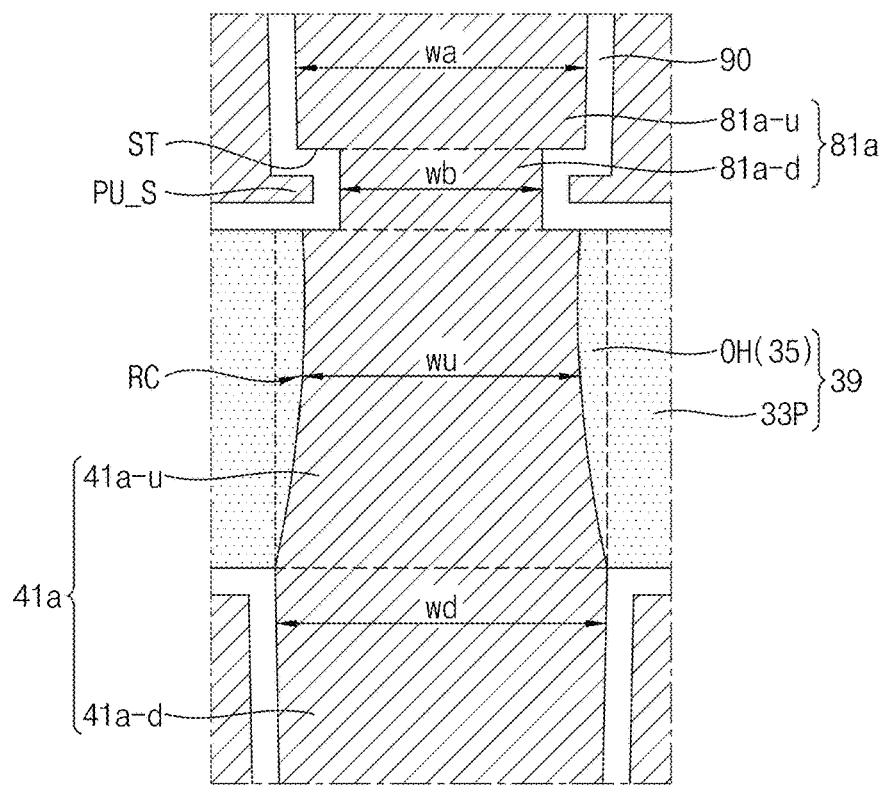
FIGS. 3A and 3B are enlarged cross-sectional views of a region P1 of FIG. 2 according to an embodiment.
Figure 3B:
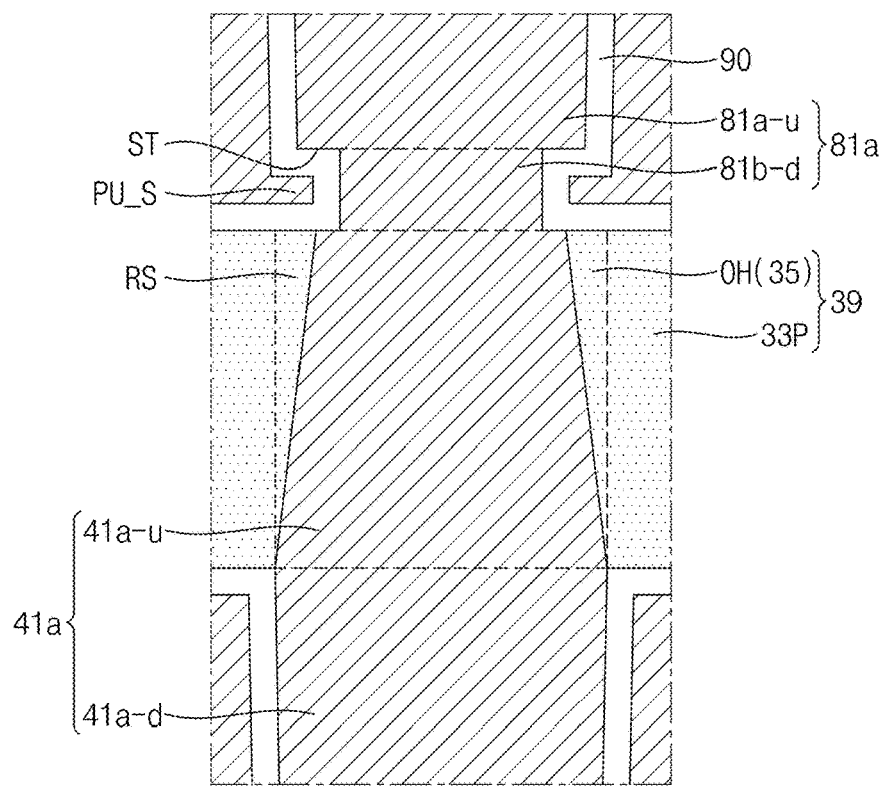
Figure 3C:
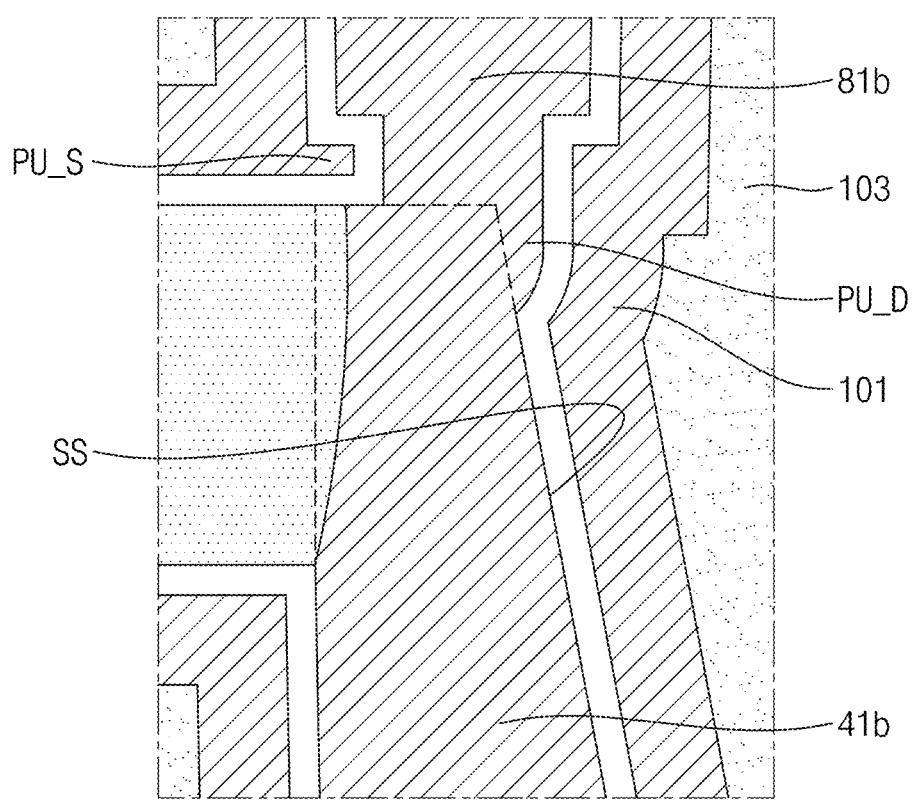
FIG. 3C is an enlarged cross-sectional view of a region P2 of FIG. 2 according to an embodiment.

FIG. 1 is a plan view illustrating an upper supporter pattern 70 and storage node electrodes 40 and 80 of a semiconductor device according to an embodiment. FIG. 2 is a vertical cross-sectional view taken along line I-I' of FIG. 1 for schematically illustrating the semiconductor device according to an embodiment. FIGS. 3A and 3B are enlarged cross-sectional views of a region P1 of FIG. 2 according to an embodiment. FIG. 3C is an enlarged cross-sectional view of a region P2 of FIG. 2 according to an embodiment.

Referring to FIGS. 1 and 2, the semiconductor device may include a substrate 10, a lower etch stop layer ESL, a lower supporter pattern 30, a plurality of storage node electrodes 40 and 80, an upper supporter pattern 70, a dielectric layer 90, and a plate electrode 100.

The substrate 10 may include a semiconductor substrate such as a silicon wafer. The substrate 10 may include a cell region where a plurality of memory cells are provided and a core/peri region which controls the memory cells. A plurality of semiconductor devices provided in the cell region of the substrate 10 may each include a lower structure 11 and a connection structure 12. For example, the lower structure 11 may include a source/drain region, and the connection structure 12 may include a storage node contact and/or a landing pad. The connection structure 12 may be electrically divided by an interlayer insulation layer on the substrate 10.

The lower etch stop layer ESL may be disposed on the substrate 10. The lower etch stop layer ESL may be disposed on the interlayer insulation layer 13 and may expose a top surface of the connection structure 12. For example, the lower etch stop layer ESL may include, like silicon oxide (SiN) or silicon oxynitride (SiON), a material having etch selectivity with respect to silicon oxide ($SiO_2$).

The storage node electrodes 40 and 80 may be disposed on the substrate 10. The storage node electrodes 40 and 80, as illustrated in FIG. 1, may be repeatedly arranged in a first direction D1 and a second direction D2. The storage node electrodes 40 and 80 may be formed in a honeycomb structure where the storage node electrodes 40 and 80 are arranged to be staggered with respect to storage node electrodes 40 and 80 of adjacent rows or columns. When the storage node electrodes 40 and 80 are arranged to be staggered in zigzag, a distance between adjacent storage node electrodes 40 and 80 may be constant. In an embodiment, the storage node electrodes 40 and 80 may be arranged in a lattice pattern along a column direction and a row direction.

The storage node electrodes 40 and 80 may be electrically connected to the connection structure 12. The storage node electrodes 40 and 80 may directly contact a top surface of the connection structure 12 (for example, a landing pad of DRAM). The storage node electrodes 40 and 80 may have a pillar shape and/or a cylindrical shape. The storage node electrodes 40 and 80 may include metal or a metal compound. For example, the storage node electrodes 40 and 80 may include at least one of metal nitrides such as titanium nitride (TiN), titanium silicon nitride (TiSiN), titanium aluminium nitride (TiAlN), tantalum aluminium nitride (TaAlN), and tungsten nitride (WN).

The storage node electrodes 40 and 80 may each have a multi-layer structure. The storage node electrodes 40 and 80 may include a bottom sub-electrode 40 and a top sub-electrode 80, which are vertically stacked on the substrate 10. The bottom sub-electrode 40 may be disposed on the connection structure 12, and the top sub-electrode 80 may be disposed on the bottom sub-electrode 40. The top sub-electrode 80 may contact the bottom sub-electrode 40 and may be electrically connected thereto.

The supporter patterns 30 and 70 may be disposed in contact with side surfaces of the storage node electrodes 40 and 80, respectively, and may support the storage node electrodes 40 and 80 so as not to fall. The supporter patterns 30 and 70 may include the lower supporter pattern 30 contacting a portion of a side surface of the bottom sub-electrode 40 and the upper supporter pattern 70 contacting a portion of a side surface of the top sub-electrode 80.

The lower supporter pattern 30 may include a first lower supporter pattern 31 and a second lower supporter pattern 39. The first lower supporter pattern 31 may cover a portion of the side surface of the bottom sub-electrode 40. The second lower supporter pattern 39 may be disposed at a level which is higher than the first lower supporter pattern 31. The second lower supporter pattern 39 may contact an upper side surface of the bottom sub-electrode 40.

The upper supporter pattern 70 may include a first upper supporter pattern 71 and a second upper supporter pattern 73. The first upper supporter pattern 71 may cover a portion of the side surface of the top sub-electrode 80. The second upper supporter pattern 73 may contact an upper side surface of the top sub-electrode 80.

The dielectric layer 90 may be disposed on the storage node electrodes 40 and 80. The dielectric layer 90 may conformally cover a surface of the bottom sub-electrode 40, a surface of the lower supporter pattern 30, a surface of the top sub-electrode 80, a surface of the upper supporter pattern 70, and a surface of the lower etch stop layer ESL.

The dielectric layer 90 may include at least one of metal oxides such as hafnium oxide ($Hf_xO_y$), aluminium oxide ($Al_xO_y$), titanium oxide ($Ti_xO_y$), tantalum oxide ($Ta_xO_y$), ruthenium oxide ($Ru_xO_y$), lanthanum oxide ($La_xO_y$), or zirconium oxide ($ZrO_2$), a dielectric material having a perovskite structure such as $SrTiO_3$(STO), (Ba, Sr)$TiO_3$ (BST), $BaTiO_3$, lead zirconate titanate (PZT), lead lanthanum zirconium titanate (PLZT), silicon oxide, and silicon nitride.

The plate electrode 100 may be disposed on the dielectric layer 90. The plate electrode 100 may include a top plate electrode 103 and a bottom plate electrode 101. The bottom plate electrode 101 may be formed to conformally cover the dielectric layer 90. The top plate electrode 103 may be disposed on the bottom plate electrode 101. The top plate electrode 103 may fill a spare space between the bottom plate electrode 101, remaining after the bottom plate electrode 101 is formed, For example, the bottom plate electrode 101 may include at least one of metal nitrides such as TiN, TiSiN, TiAlN, TaAlN, and WN. In an embodiment, the bottom plate electrode 101 may include the same material as that of each of the storage node electrodes 40 and 80. The top plate electrode 103 may include silicon germanium (SiGe).

Referring to FIGS. 2 and 3A, in an embodiment, the bottom sub-electrode 40 may include an external bottom sub-electrode 41a, and the top sub-electrode 80 may include an external top sub-electrode 81a. The external bottom sub-electrode 41a and the external top sub-electrode 81a may each have a vertical cross-sectional surface having a symmetrical structure. The external top sub-electrode 81a may be stacked on the external bottom sub-electrode 41a.

An upper side surface of the external bottom sub-electrode 41a adjacent to the external top sub-electrode 81a may include a recess RC. The recess RC may have a concave shape where a side surface of the external bottom sub-electrode 41a is inward recessed. The external bottom sub-electrode 41a may include an upper portion 41a-u including the recess RC and a lower portion 41a-d disposed at a level which is lower than the recess RC. A minimum width wu of the upper portion 41a-u including the recess RC may be narrower than a maximum width wd of a top end of the lower portion 41a-d.

The external top sub-electrode 81a may include a step ST which extends from a side surface thereof, which is adjacent to the external bottom sub-electrode 41a, to an inner portion of the external top sub-electrode 81a. The step ST may have a stepped structure and may have a side profile where a width of the external bottom sub-electrode 41a is narrowed. The external top sub-electrode 81a may include a lower portion 81a-d, disposed at a level which is lower than the step ST, and an upper portion 81a-u disposed at a level which is higher than the step ST. A maximum width wb of the lower portion 81a-d may be narrower than a minimum width wa of the upper portion 81a-u. The maximum width wb of the lower portion 81a-d may be less than a width of a top end of the external bottom sub-electrode 41a.

The external top sub-electrode 81a may be vertically aligned with the external bottom sub-electrode 41a, and thus, a bottom surface of the external top sub-electrode 81a may contact a top surface of the external bottom sub-electrode 41a and a portion of the top surface of the external bottom sub-electrode 41a may be exposed. The external top sub-electrode 81a may be apart from the second lower supporter pattern 39 without contact therebetween.

The second lower supporter pattern 39 may include an overhang OH vertically overlapping the bottom sub-electrode 40. The overhang OH of the second lower supporter pattern 39 may contact the recess RC of the second lower supporter pattern 39. The second lower supporter pattern 39 may include a flat top surface. A level of the top surface of the second lower supporter pattern 39 may be the same as that of a top end of the bottom sub-electrode 40.

The second lower supporter pattern 39 may include a round side surface. That is, an outer surface of the overhang OH may include a round side surface. Therefore, the second lower supporter pattern 39 may have a round shape which is rounded to be convex toward the upper portion 81a-u of the bottom sub-electrode 40. The round side surface of the second lower supporter pattern 39 may contact the recess RC of the bottom sub-electrode 40.

The bottom plate electrode 101 may include a side protrusion portion PU_S at a side surface thereof adjacent to the step ST of the top sub-electrode 80. The side protrusion portion PU_S may extend outward toward the lower portion 81a-d of the top sub-electrode 80, and the bottom plate electrode 101 may have a side profile where a width increases in a lower portion thereof. The side protrusion portion PU_S may be disposed between the step ST of the top sub-electrode 80 and the top surface of the bottom sub-electrode 40 exposed by the lower portion 81a-d of the top sub-electrode 80. In a top view, the side protrusion portion PU_S may have a ring shape.

Referring to FIGS. 2 and 3B, in an embodiment, the recess RS of the external bottom sub-electrode 41a may be a positive (+) inclined surface which extends upward toward an inner portion thereof. The upper portion 40a-u of the bottom sub-electrode 40 of a region adjacent to the top sub-electrode 80 may have a trapezoidal shape where a width of a vertical cross-sectional surface thereof is progressively narrowed in an upward direction. The second lower supporter pattern 39 may have an inverted trapezoidal shape where a width thereof is progressively widened in an upward direction. A vertical cross-sectional surface of the overhang OH of the second lower supporter pattern 39 may have an inverted triangular shape.

Referring to FIGS. 2 and 3C, the top sub-electrode 80 may include an internal bottom sub-electrode 41b and an internal top sub-electrode 81b. The internal bottom sub-electrode 41b and the internal top sub-electrode 81b may each have a vertical cross-sectional surface having an asymmetrical structure. The internal top sub-electrode 81b may be stacked on the internal bottom sub-electrode 41b.

The internal bottom sub-electrode 41b may include an inclined surface SS at a level which is higher than the first lower supporter pattern 31 and may include a recess RC in a region adjacent to the internal top sub-electrode 41a. The recess RC may be formed at a level which is higher than a bottom end of the second lower supporter pattern 39. The recess RC may contact the second lower supporter pattern 39, and the inclined surface SS may be covered by the internal top sub-electrode 81b and the dielectric layer 90.

The internal top sub-electrode 81b may include a step ST having a stepped structure at a lower side surface adjacent to the internal bottom sub-electrode 41b. The internal top sub-electrode 81b may include a downward protrusion portion PU_D which extends in a downward direction from a portion of a bottom surface thereof. The downward protrusion portion PU_D may extend up to a level which is lower than a top end of the internal bottom sub-electrode 41b. The downward protrusion portion PU_D may cover a portion of inclined surface SS of the internal bottom sub-electrode 41b. The downward protrusion portion PU_D may be disposed between the inclined surface SS of the internal bottom sub-electrode 41b and the dielectric layer 90.

Figure 4:
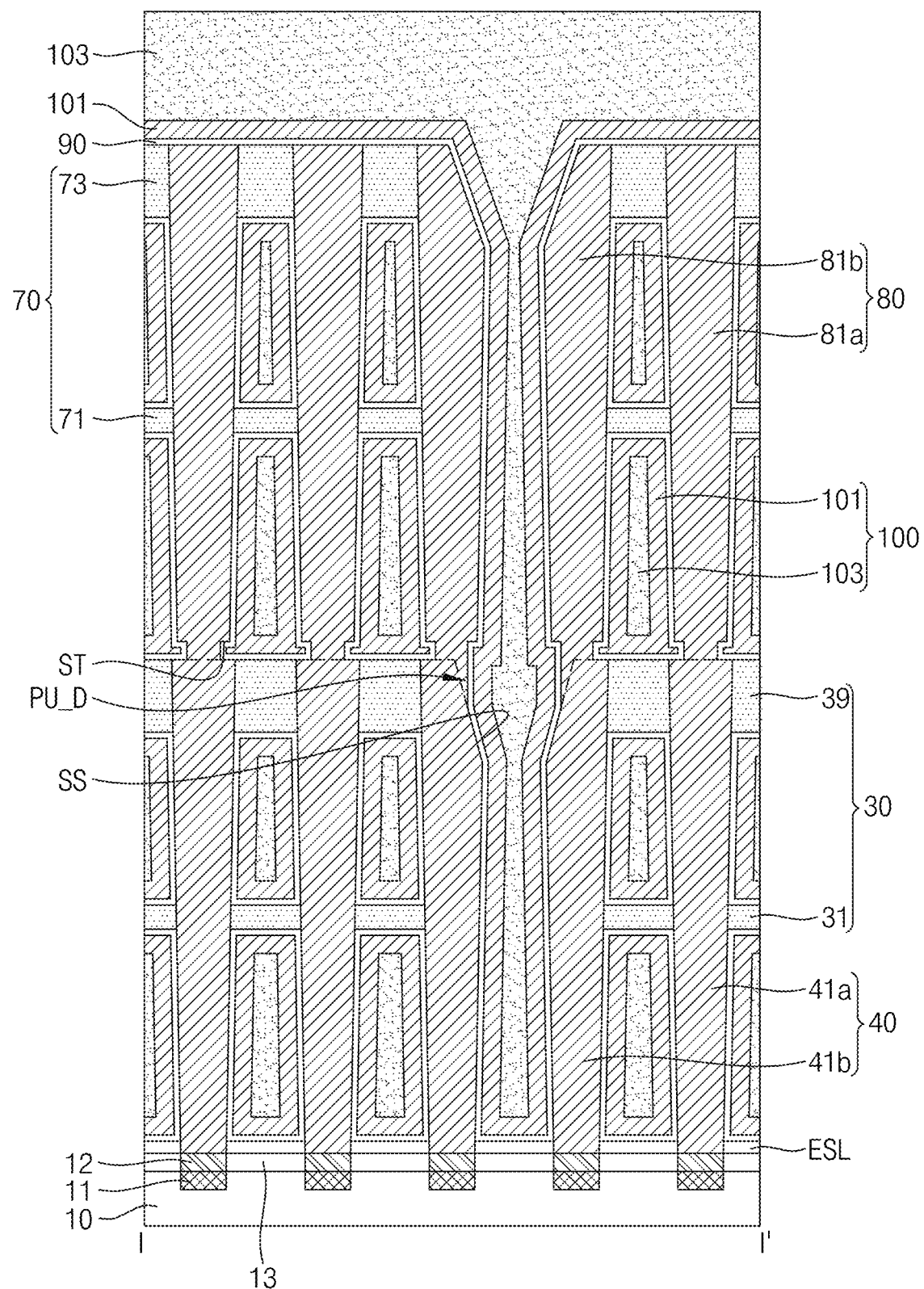
FIG. 4 is a vertical cross-sectional view taken along line I-I' of FIG. 1 for schematically illustrating a semiconductor device according to an embodiment.

FIG. 4 is a vertical cross-sectional view taken along line I-I' of FIG. 1 for schematically illustrating a semiconductor device according to an embodiment.

Referring to FIG. 4, in an embodiment, an external bottom sub-electrode 41a may have a wholly flat side profile. The second lower supporter pattern 39 may also have a flat side profile and may not include an overhang OH.

An internal bottom sub-electrode 41b may include an inclined surface SS with respect to an upper side surface thereof adjacent to a top sub-electrode 80. The inclined surface SS may have an inclined profile with respect to a top surface of a substrate 10. A downward protrusion portion PU_D of an internal top sub-electrode 81b may cover a portion of the inclined surface SS of the internal bottom sub-electrode 41b. The downward protrusion portion PU_D may extend in a downward direction along the inclined surface SS of the internal bottom sub-electrode 41b and may have an inverted triangular shape where a width thereof is progressively narrowed toward a downward direction.

Figure 5:
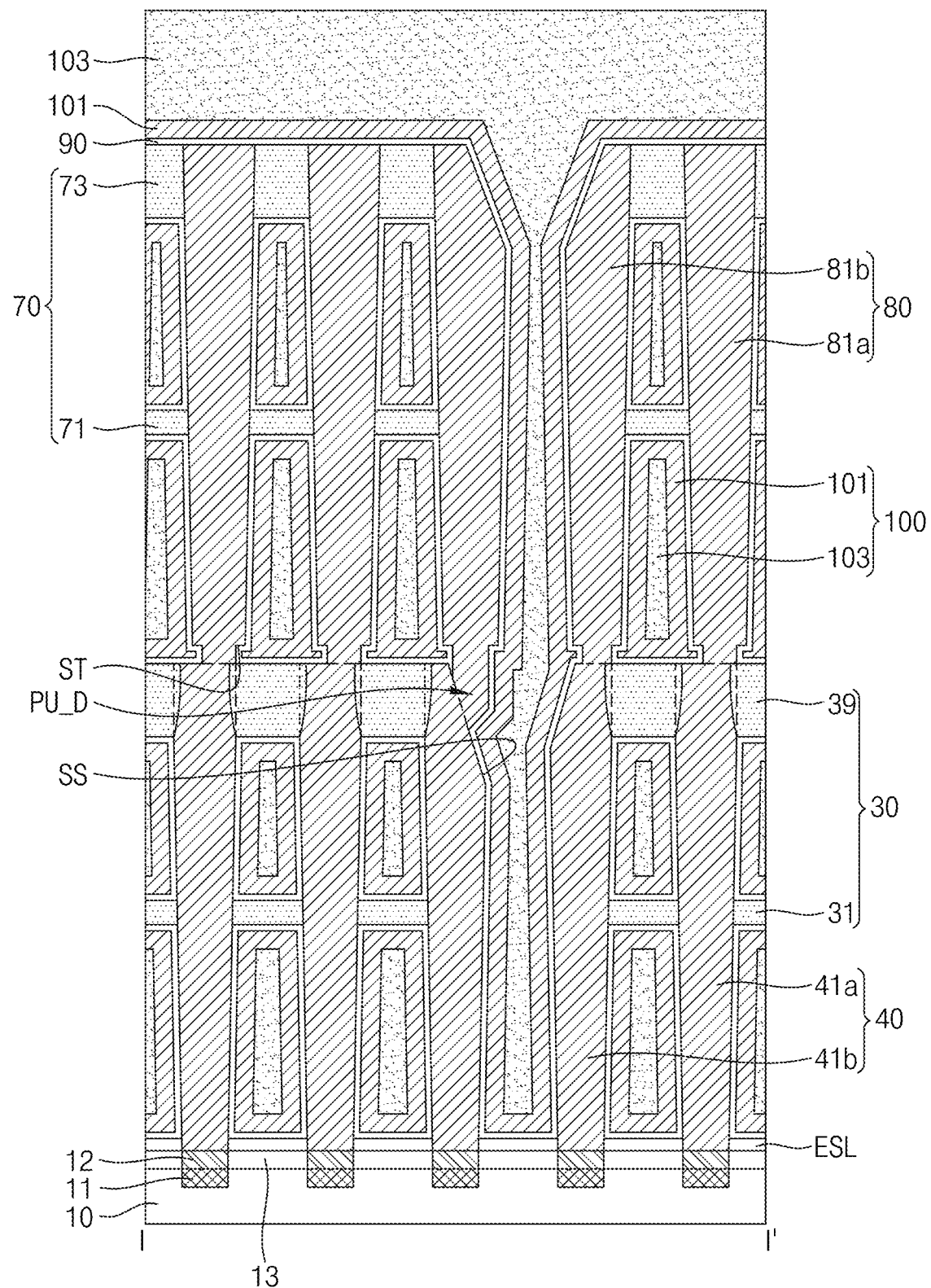
FIGS. 5 and 6 are vertical cross-sectional views taken along line I-I' of FIG. 1 for schematically illustrating a semiconductor device according to an embodiment.
Figure 6:
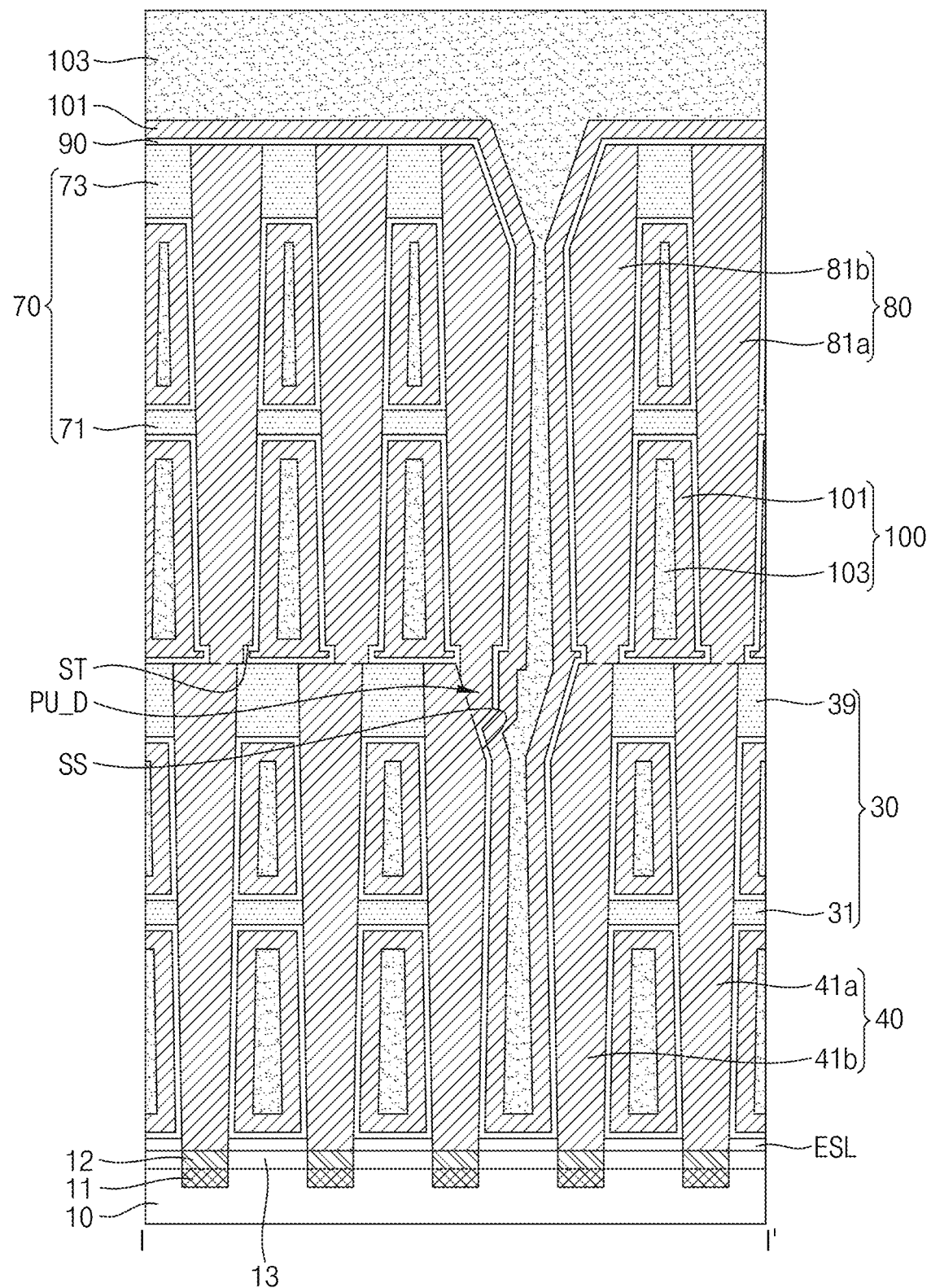

FIGS. 5 and 6 are vertical cross-sectional views taken along line I-I' of FIG. 1 for schematically illustrating a semiconductor device according to an embodiment.

Referring to FIGS. 5 and 6, a top sub-electrode 80 may be misaligned with respect to a bottom sub-electrode 40. An external top sub-electrode 81a may be disposed on an internal bottom sub-electrode 41b as well as an external bottom sub-electrode 41a.

A bottom surface of the external top sub-electrode 81a disposed on the external bottom sub-electrode 41a may contact a top surface of each of the bottom sub-electrode 40 and a second lower supporter pattern 39. A bottom surface of the external top sub-electrode 81a disposed on the internal bottom sub-electrode 41b may contact a top surface of the internal bottom sub-electrode 41b and the top surface of the second lower supporter pattern 39.

A downward protrusion portion PU_D of an internal top sub-electrode 81b may contact an inclined surface SS of the internal bottom sub-electrode 41b and may not contact the top surface of the internal bottom sub-electrode 41b.

Figure 7:
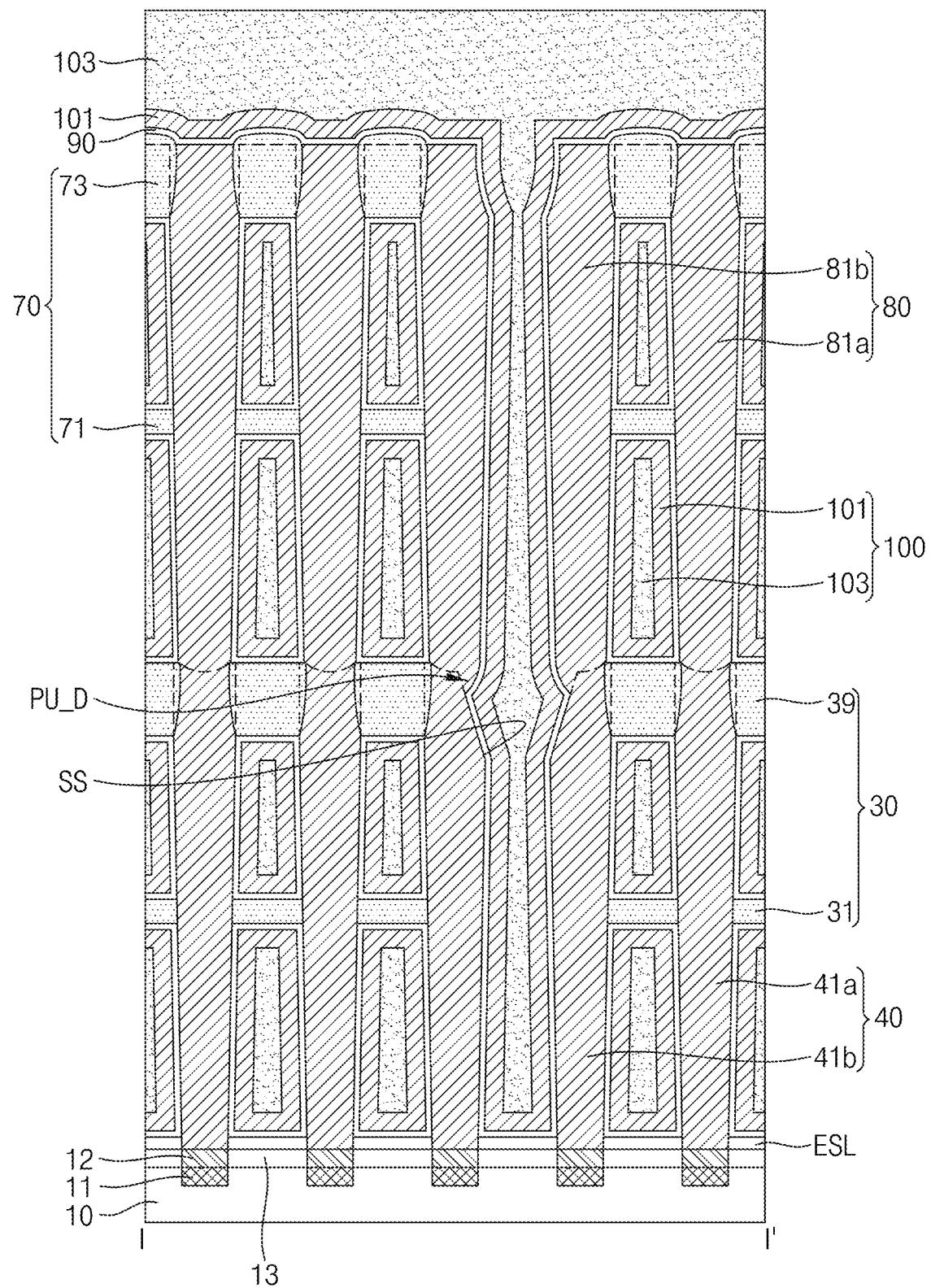
FIG. 7 is a vertical cross-sectional view taken along line I-I' of FIG. 1 for schematically illustrating a semiconductor device according to an embodiment.
Figure 8:
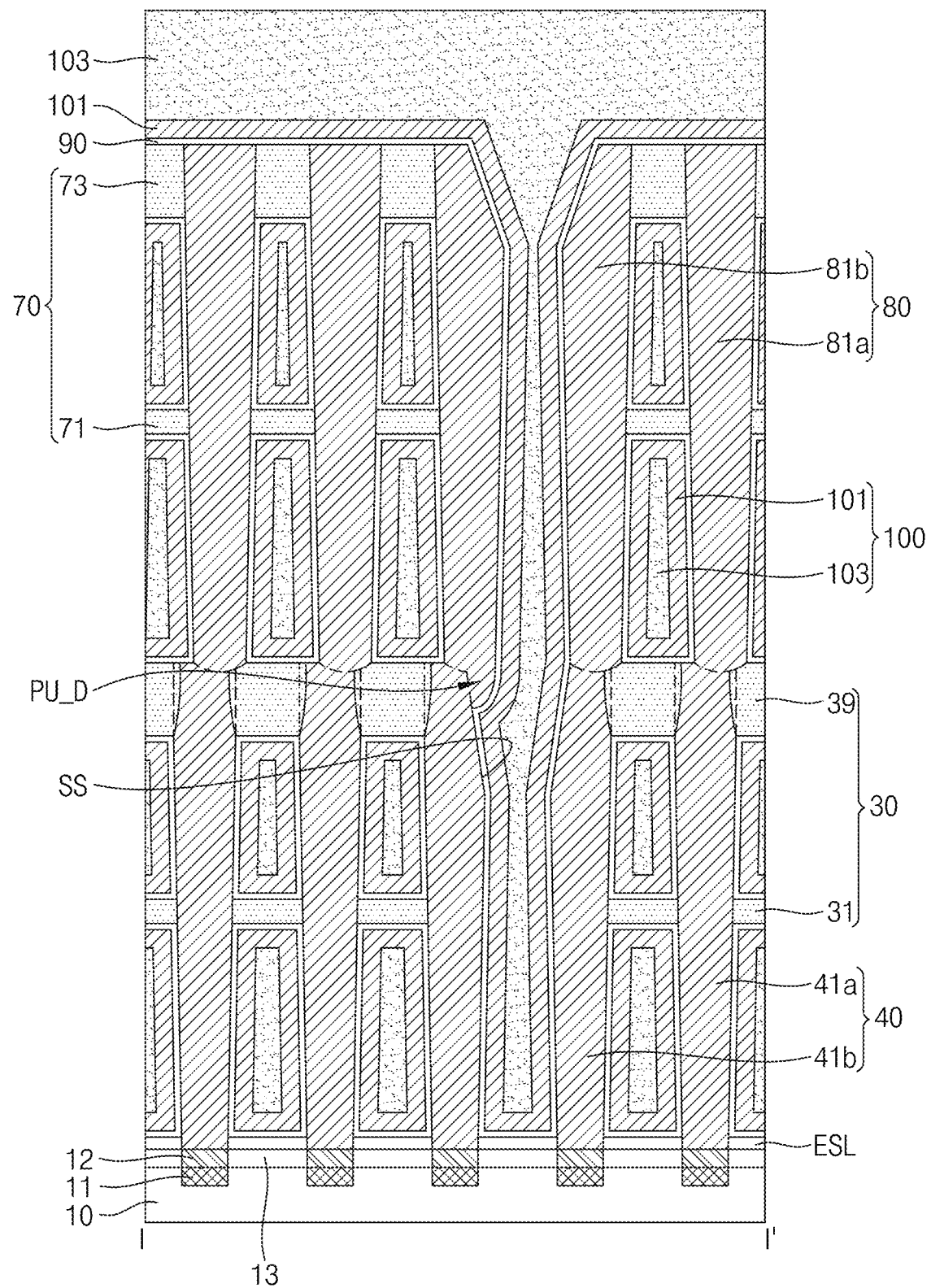
FIG. 8 is a vertical cross-sectional view taken along line I-I' of FIG. 1 for schematically illustrating a semiconductor device according to an embodiment.

FIG. 7 is a vertical cross-sectional view taken along line I-I' of FIG. 1 for schematically illustrating a semiconductor device according to an embodiment. FIG. 8 is a vertical cross-sectional view taken along line I-I' of FIG. 1 for schematically illustrating a semiconductor device according to an embodiment.

Referring to FIGS. 7 and 8, a top sub-electrode 80 may have a wholly flat side profile at a level which is higher than a top end of a second lower supporter pattern 39. The top sub-electrode 80 may not include a step ST.

FIGS. 9 to 25 are vertical cross-sectional surfaces for describing a method of manufacturing a semiconductor device, according to an embodiment.

Figure 9:
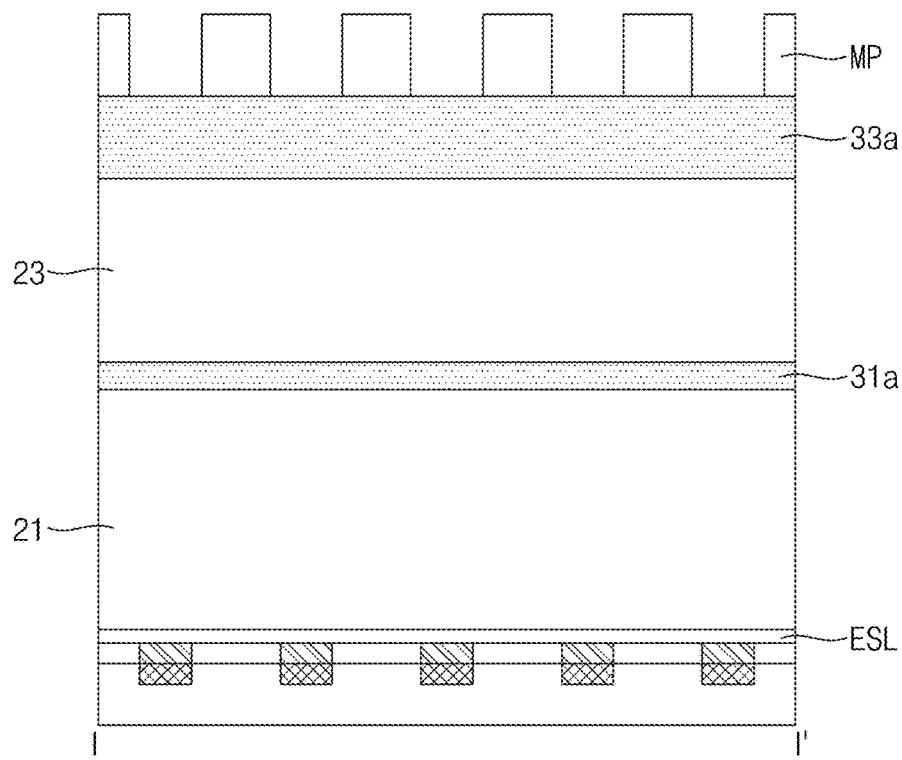
FIGS. 9 to 25 are vertical cross-sectional surfaces for describing a method of manufacturing a semiconductor device, according to an embodiment.

Referring to FIG. 9, the method may include a process of providing a substrate 10, a process of forming a bottom mold structure on the provided substrate 10, and a process of forming a mask pattern MP on the bottom mold structure.

The process of forming the bottom mold structure may include a process of sequentially forming a lower etch stop layer ESL, a first bottom mold layer 21, a first lower supporter layer 31a, a second bottom mold layer 23, and a second lower supporter layer 33a on the substrate 10.

The lower etch stop layer ESL may be formed to wholly cover a top surface of the substrate 10. For example, the lower etch stop layer ESL may include SiN or SiON.

The first bottom mold layer 21 and the second bottom mold layer 23 may include a material having etch selectivity with respect to the lower etch stop layer ESL and the first lower supporter layer 31a. For example, the first bottom mold layer 21 and the second bottom mold layer 23 may include $SiO_2$. The first lower supporter layer 31a may include at least one of SiN, SiON, and silicon carbonitride (SiCN).

The second lower supporter layer 33a may include a material having etch selectivity with respect to the second bottom mold layer 23. In an embodiment, the second lower supporter layer 33a may include a material where step coverage is bad. For example, the second lower supporter layer 33a may include at least one of SiCN and silicon boron nitride (SiBN).

The mask pattern MP may be formed on the second lower supporter layer 33a. A mask layer covering the second lower supporter layer 33a may be formed, and the mask pattern MP may be formed by patterning the mask layer, whereby a top surface of the second lower supporter layer 33a may be selectively exposed. The mask pattern MP may include a material having etch selectivity with respect to the second lower supporter layer 33a. For example, the mask pattern MP may include at least one of a polysilicon layer, an amorphous silicon layer, a silicon oxide layer, a silicon oxynitride layer, a spin on hard (SOH) mask layer, and a polymer organic material layer.

Figure 10:
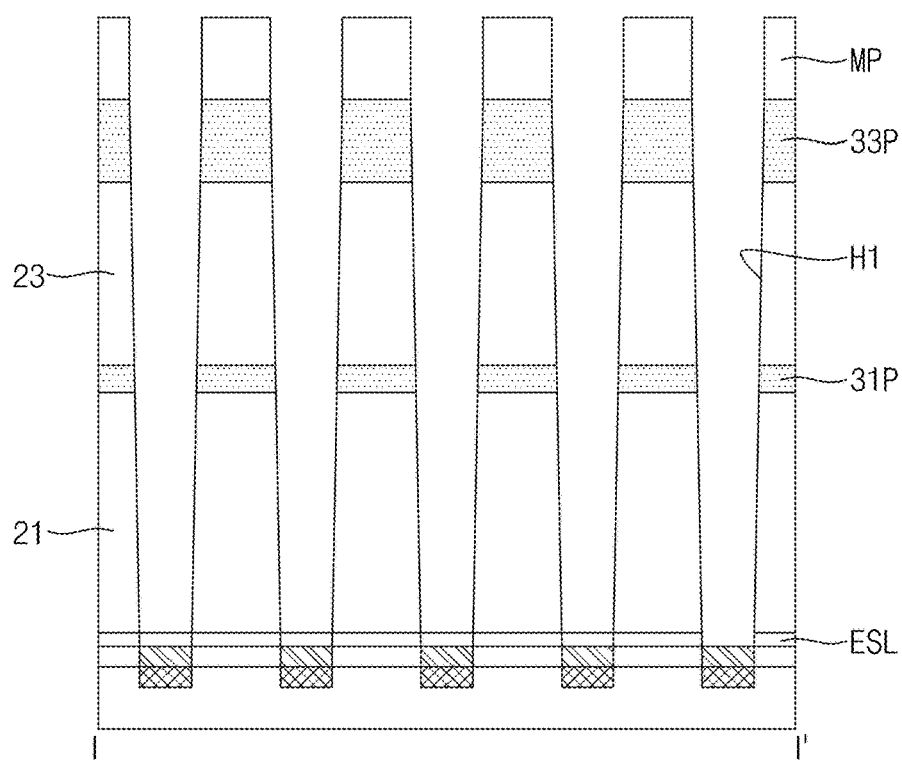

Referring to FIG. 10, the method may include a process of forming a bottom storage node electrode hole H1 passing through the bottom mold structure. The bottom storage node electrode hole H1 may pass through the lower etch stop layer ESL, the first bottom mold layer 21, the first lower supporter layer 31a, the second bottom mold layer 23, and the second lower supporter layer 33a of the bottom mold structure. The bottom storage node electrode hole H1 may expose a connection structure 12 of the substrate 10. The bottom storage node electrode hole H1 may be formed by an etch process using the mask pattern MP as an etch mask. The bottom storage node electrode hole H1 may be formed by an anisotropic etch process. As the bottom storage node electrode hole H1 is formed, a first preliminary lower supporter pattern 31P may be formed by patterning the first lower supporter layer 31a, and a second preliminary lower supporter pattern 33P may be formed by patterning the second lower supporter layer 33a. The bottom storage node electrode hole H1 may be formed, and the mask pattern MP may be removed.

The bottom storage node electrode hole H1 may have a certain width. In an embodiment, the bottom storage node electrode hole H1 may have a tapered shape where a width thereof is narrowed toward the substrate 10. After the bottom storage node electrode hole H1 is formed, a cleaning process of removing impurities which occur in the process of forming the bottom storage node electrode hole H1 may be performed.

Figure 11:
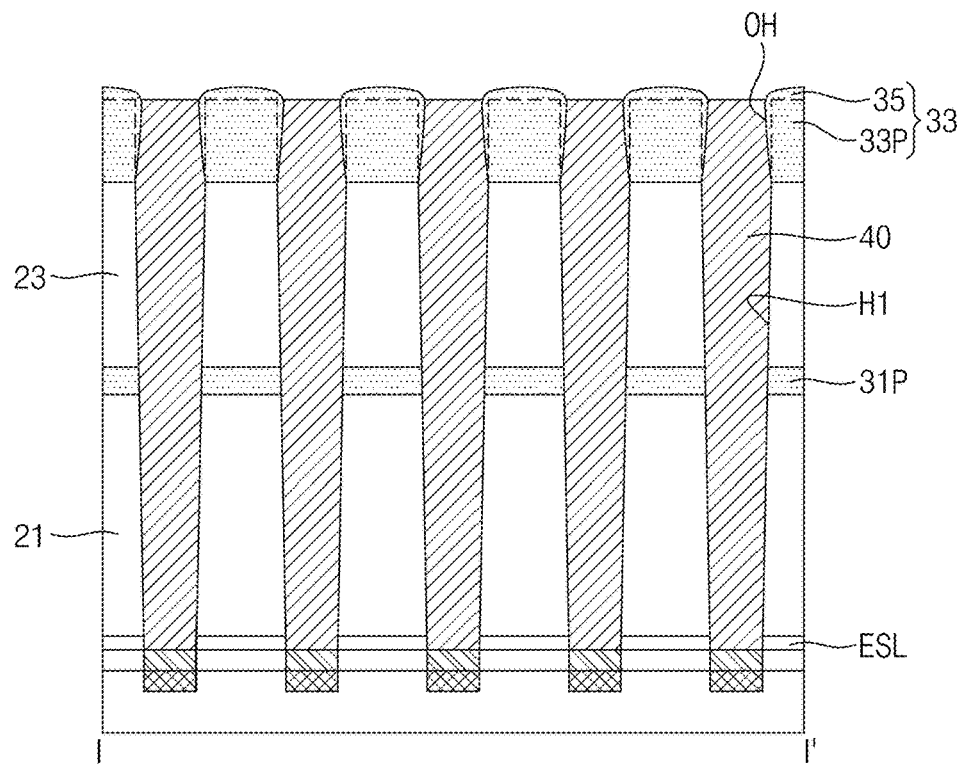

Referring to FIG. 11, the method may include a process of forming a bottom sub-electrode 40 and a second preliminary lower supporter pattern 33 including an overhang OH. A lower capping layer 35 covering a surface of the second preliminary lower supporter pattern 33P may be formed, and thus, the second preliminary lower supporter pattern 33 including the overhang OH may be formed. The lower capping layer 35 may be formed by using a process such as a plasma enhanced chemical vapour deposition (PECVD) process, where step coverage is bad.

The lower capping layer 35 may not conformally be formed on the second preliminary lower supporter pattern 33P. For example, a thickness of the lower capping layer 35 formed on a top surface of the second preliminary lower supporter pattern 33P may be thicker than a thickness of the lower capping layer 35 formed on a side surface of the second preliminary lower supporter pattern 33.

A thickness of the lower capping layer 35 on the side surface of the second preliminary lower supporter pattern 33P may not be uniform. For example, a thickness of the lower capping layer 35 covering the side surface of the second preliminary lower supporter pattern 33P may be thicker in an upper portion thereof than a lower portion thereof. Therefore, the surface of the second preliminary lower supporter pattern 33P including the lower capping layer 35 may be formed convexly.

The lower capping layer 35 may include a material where step coverage is bad. In an embodiment, the lower capping layer 35 may include the same material as that of the second preliminary lower supporter pattern 33P. For example, the lower capping layer 35 may include at least one of SiCN and SiBN.

The bottom sub-electrode 40 may be formed to fill the bottom storage node electrode hole H1. An electrode material layer filling the bottom storage node electrode hole H1 and covering the second preliminary lower supporter pattern 33P may be formed, and the bottom sub-electrode 40 may be formed by removing a portion of the electrode material layer through a partial etch back process. A top end of the bottom sub-electrode 40 may be disposed at a level which is equal to or lower than a top end of the second preliminary lower supporter pattern 33P.

The bottom sub-electrode 40 may include metal or metal nitride. For example, the bottom sub-electrode 40 may include TiN. The bottom sub-electrode 40 may be formed by a process such as a chemical vapor deposition (CVD) process, an atomic layer deposition (ALD) process, or a plasma enhanced atomic layer deposition (PEALD) process.

Figure 12:
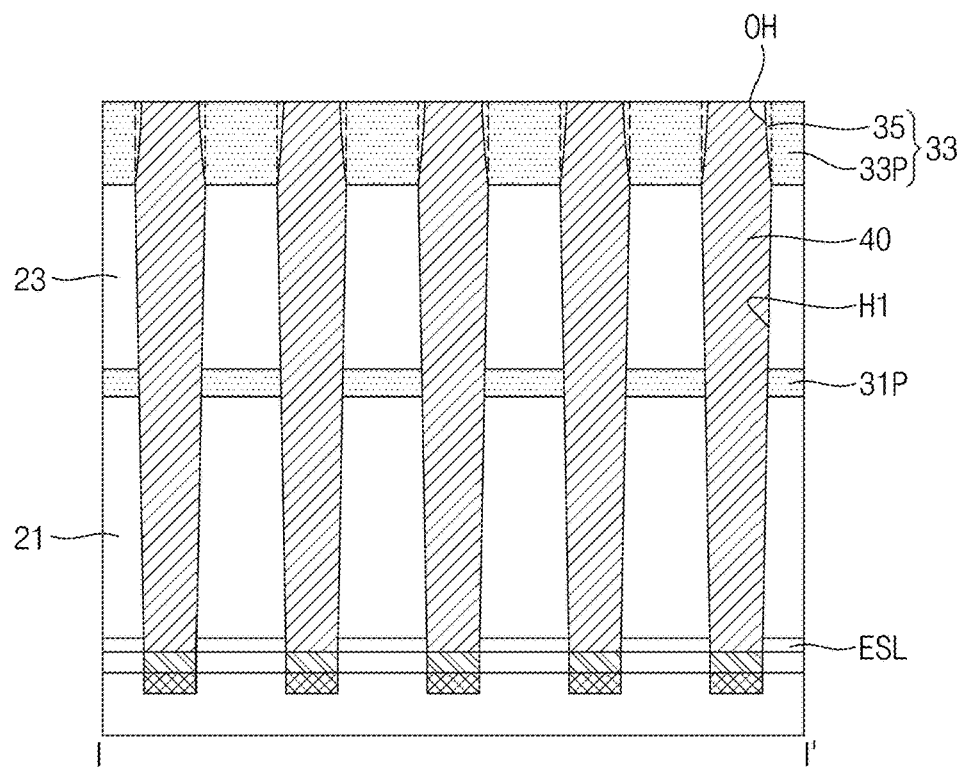

Referring to FIG. 12, the method may include a process of planarizing a top surface of the second preliminary lower supporter pattern 33P and a top surface of the bottom sub-electrode 40. The top surface of the second preliminary lower supporter pattern 33P and a top surface of the bottom sub-electrode 40 may be coplanar, based on the planarization process. Based on the planarization process, an upper portion of the lower capping layer 35 may be removed, and thus, the second lower supporter layer 33a may be exposed. For example, the planarization process may be a chemical mechanical polishing (CMP) process.

Figure 13:
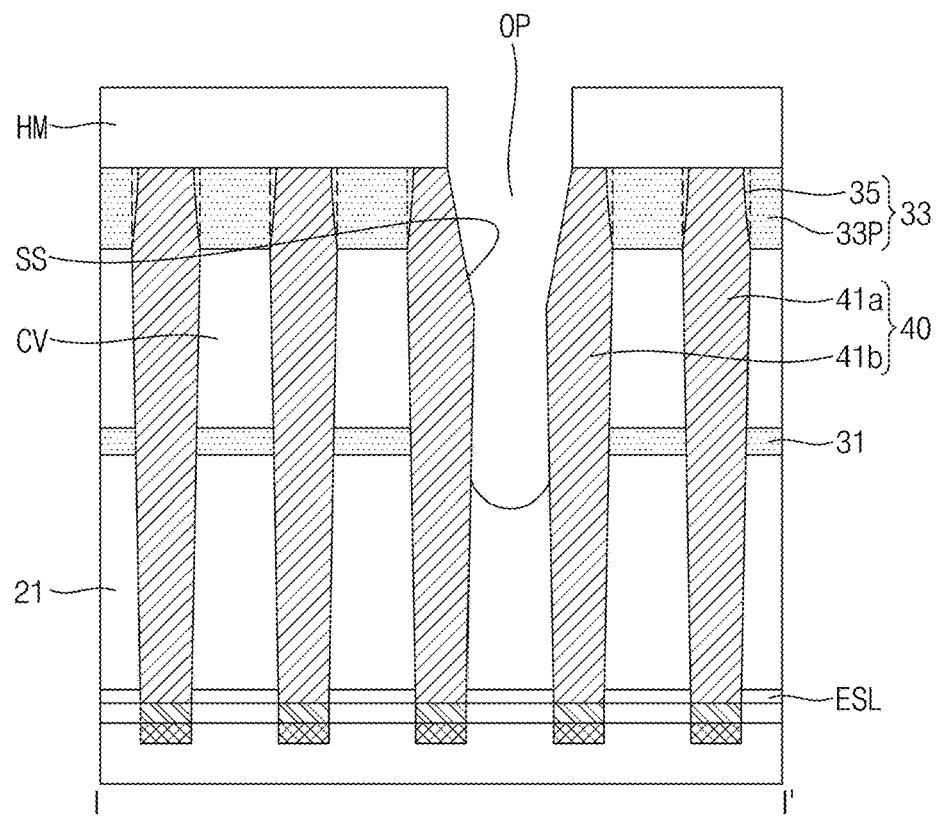

Referring to FIG. 13, the method may include a process of removing a portion of the second preliminary lower supporter pattern 33P to form a second lower supporter pattern 39 and an opening portion OP.

A hard mask pattern HM exposing a portion of a top surface of the second preliminary lower supporter pattern 33P may be formed on the second preliminary lower supporter pattern 33P and the bottom sub-electrode 40. By performing an anisotropic etch process using the hard mask pattern HM as an etch mask, the exposed portion of the second preliminary lower supporter pattern 33P may be removed, and the opening portion OP and the second lower supporter pattern 39 may be formed. In a process of forming the opening portion OP, a portion of a side surface of the bottom sub-electrode 40 may be etched, and thus, the opening portion OP may be enlarged and an inclined surface SS may be formed at an upper portion of the side surface of the bottom sub-electrode 40.

The method may include a process of removing the second bottom mold layer 23 to form a cavity CV and etching a portion of the first preliminary lower supporter pattern 31P to form a first lower supporter pattern 31. The second bottom mold layer 23 may be removed by performing a wet etch process. For example, a process of removing the second bottom mold layer 23 may include a limulus amoebocyte lysate (LAL) process.

The opening portion OP may extend in a downward direction, and the cavity CV may be formed between the first preliminary lower supporter pattern 31P and the second lower supporter pattern 39. A portion of each of a top surface of the first preliminary lower supporter pattern 31P, a bottom surface of the second lower supporter pattern 39, and a side surface of the bottom sub-electrode 40 may be exposed through the cavity CV. By etching a portion of the first preliminary lower supporter pattern 31P exposed through the opening portion OP, the first lower supporter pattern 31 may be formed, and a portion of the first bottom mold layer 21 may be exposed. A portion of the first bottom mold layer 21 may be etched in a process of forming the first lower supporter pattern 31. The first lower supporter pattern 31 may be formed, and the hard mask pattern HM may be removed.

Figure 14:
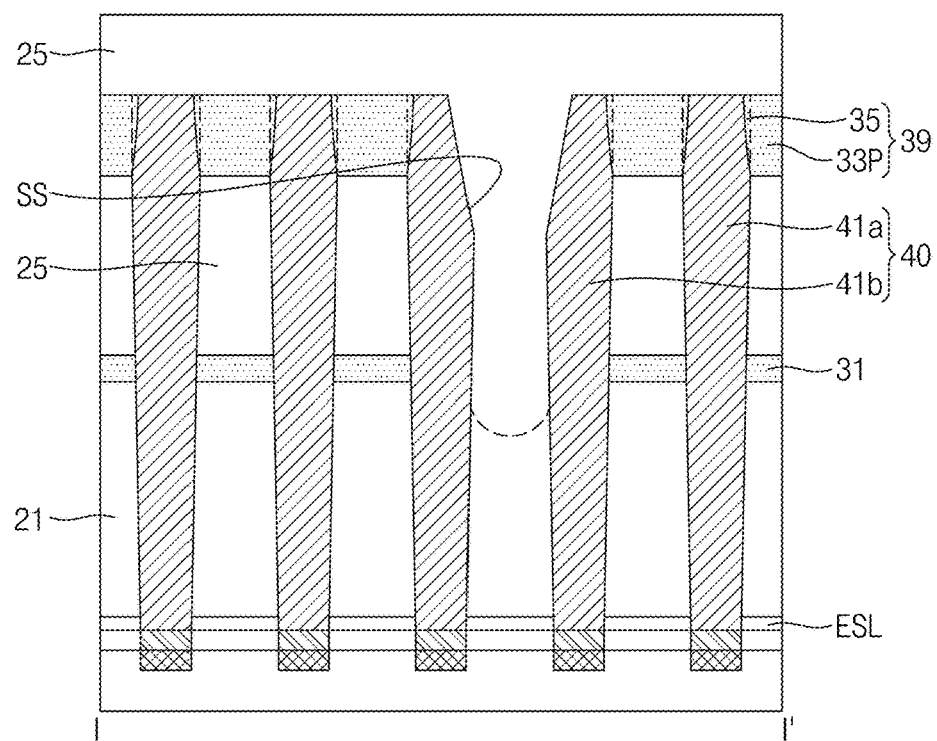

Referring to FIG. 14, the method may include a process of filling the cavity CV and the opening portion OP and forming a third bottom mold layer 25 covering a top surface of the second lower supporter pattern 39 and a top surface of the bottom sub-electrode 40. The third bottom mold layer 25 may include the same material as that of the first bottom mold layer 21. For example, the third bottom mold layer 25 may include $SiO_2$. The third bottom mold layer 25 may be formed by a process such as an ALD process, a CVD process, or a PEALD process.

Figure 15:
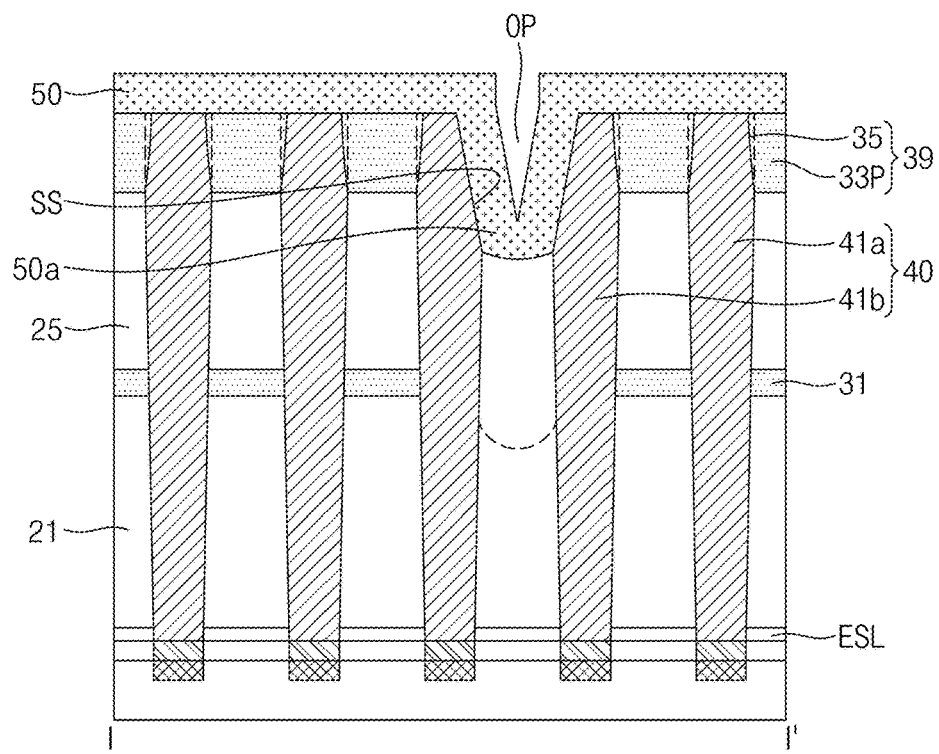

Referring to FIG. 15, the method may include a process of opening the opening portion OP again and forming an upper etch stop layer 50 filling the opening portion OP. By removing a portion of the third bottom mold layer 25 through a partial etch back process, a top surface of each of the bottom sub-electrode 40 and the second lower supporter pattern 39 may be exposed, and the opening portion OP may be opened again. Based on the opening portion OP, the inclined surface SS of the bottom sub-electrode 40 may be exposed, and a portion of a top surface of the third bottom mold layer 25 may be exposed. In a process of forming the opening portion OP, a portion of the inclined surface SS of the bottom sub-electrode 40 may be etched, and a size of the opening portion OP may increase.

The upper etch stop layer 50 may include a filler part 50a which covers a top surface of each of the second lower supporter pattern 39 and the bottom sub-electrode 40 and partially fills the opening portion OP. The filler part 50a may be formed to cover the inclined surface SS of the bottom sub-electrode 40 and the exposed portion of the third bottom mold layer 25, in the opening portion OP. The filler part 50a may extend up to a level which is lower than a bottom end of the second lower supporter pattern 39. The filler part 50a may have a U-shape or a V-shape, and even after the filler part 50a is formed, a spare space may remain in the opening portion OP. In an LAL process, the upper etch stop layer 50 may include a material which has etch selectivity higher than a lower supporter pattern 30 and an upper supporter pattern 70 (which will be described below) and has etch selectivity equal to or lower than the third bottom mold layer 25. For example, the upper etch stop layer 50 may include bowing block SiN (B—SiN) or bowing block SiON (B—SiON). In an embodiment, the upper etch stop layer 50 may include polysilicon (poly-Si).

Figure 16:
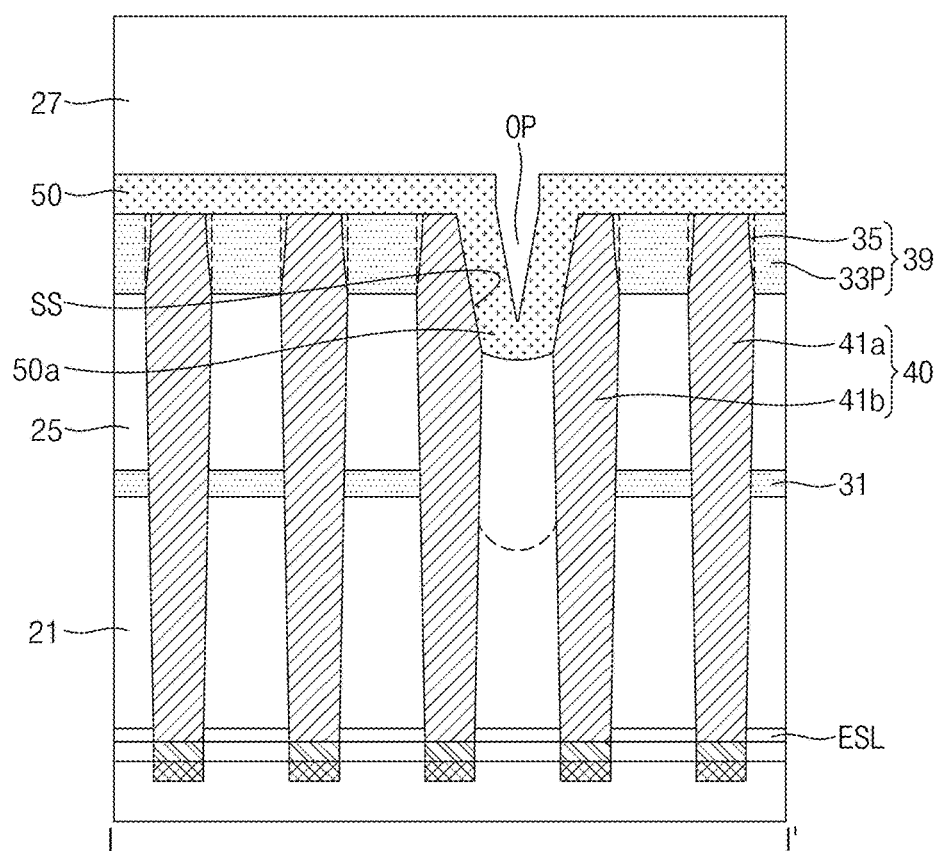

Referring to FIG. 16, the method may include a preliminary top mold layer 27 covering a top surface of the upper etch stop layer 50. The preliminary top mold layer 27 may fill the spare space of the opening portion OP. For example, the preliminary top mold layer 27 may include $SiO_2$. The preliminary top mold layer 27 may be formed by a process such as a CVD process, an ALD process, or a PEALD process.

Figure 17:
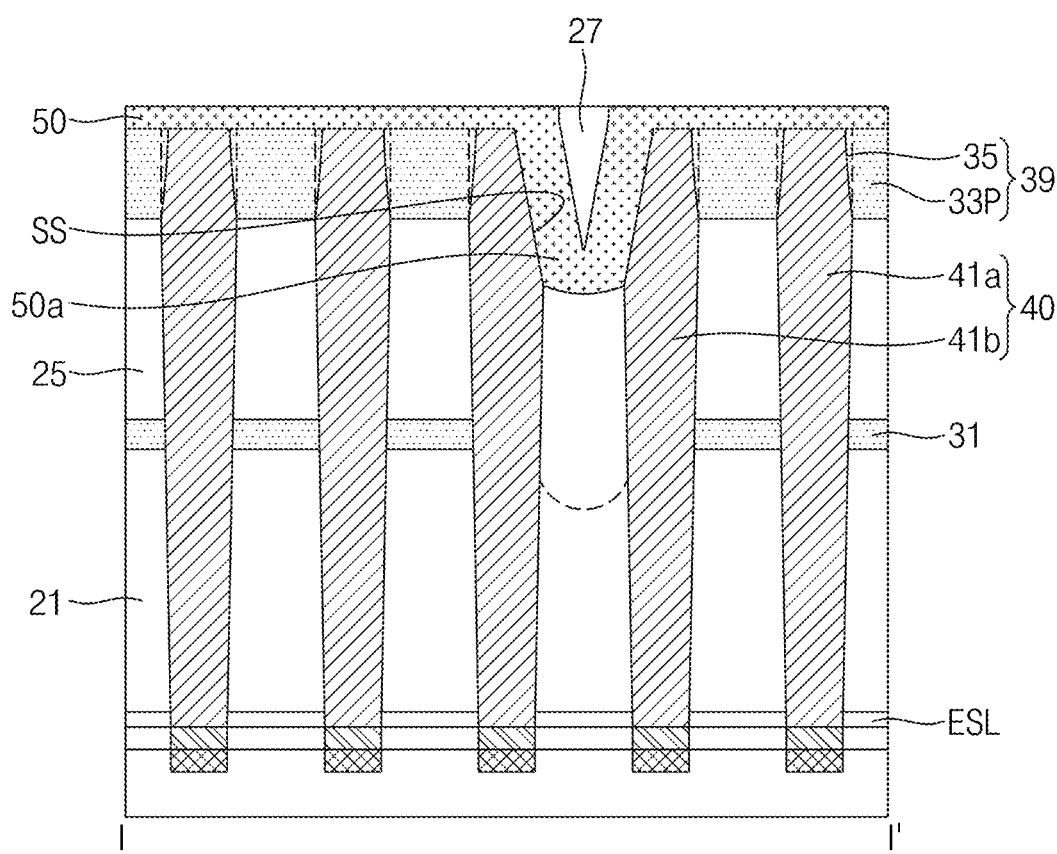

Referring to FIG. 17, the method may include performing a planarization process of exposing a top surface of the upper etch stop layer 50. The planarization process may planarize the top surface of the upper etch stop layer 50 and a top surface of the preliminary top mold layer 70. Based on the planarization process, the preliminary top mold layer 27 may be removed, and thus, the preliminary top mold layer 27 may remain in only the opening portion OP. A thickness of the upper etch stop layer 50 on the bottom sub-electrode 40 and the second lower supporter pattern 39 may be thinned. For example, the planarization process may be a CMP process. In a process of manufacturing the semiconductor device, a hole (for example, a storage node electrode hole H1) or the opening portion OP may be formed to have a density which is higher in a cell region than a core/peri region. Therefore, a step height may occur between the preliminary top mold layer 27 formed in the cell region and a preliminary top mold layer (not shown) formed in the core/peri region. The planarization process may remove a step height of the preliminary top mold layer 27 formed in the cell region and the core/peri region, and at this time, the upper etch stop layer 50 may limit and/or prevent the height loss of the bottom sub-electrode 40.

Figure 18:
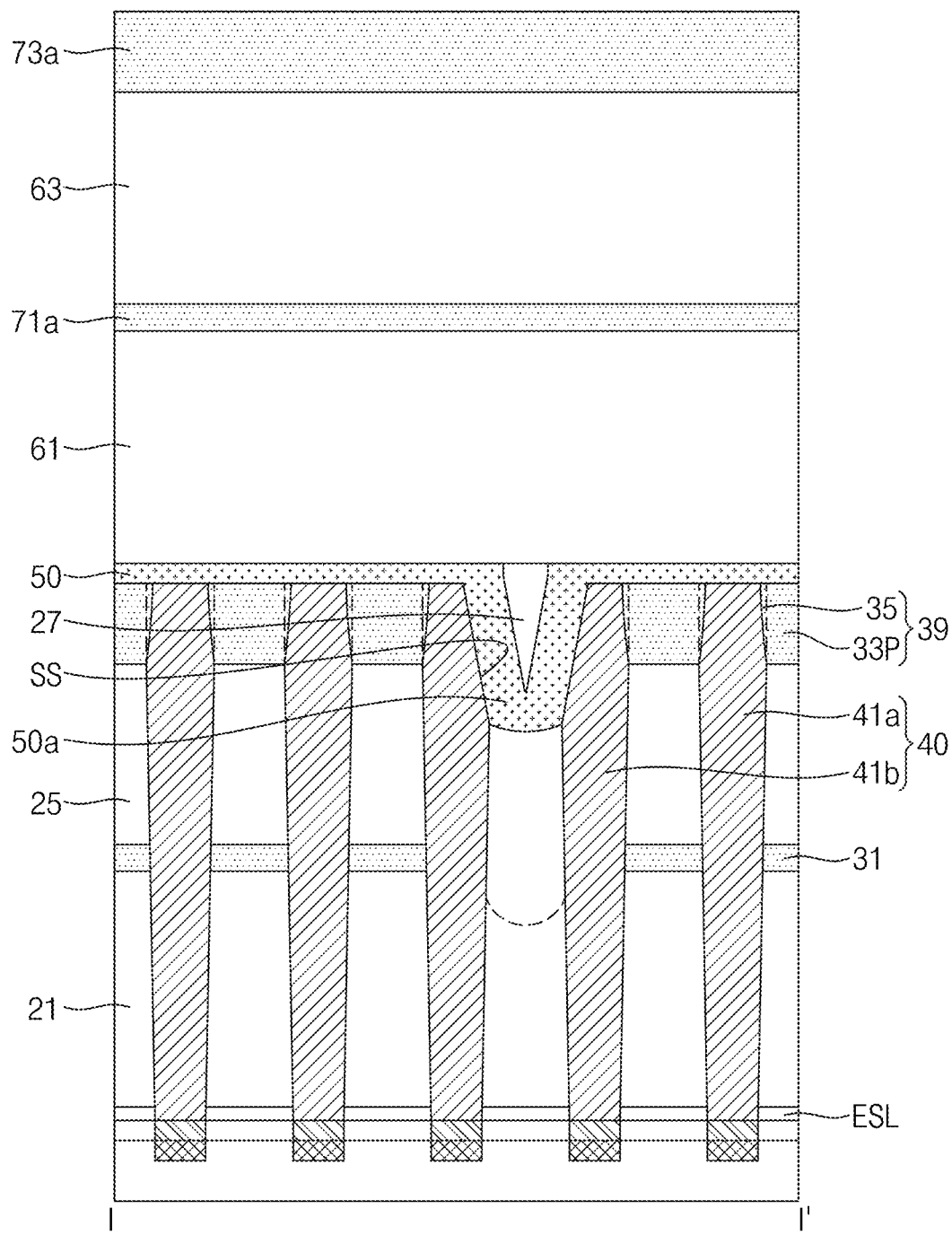

Referring to FIG. 18, the method may include a process of forming a top mold structure on the upper etch stop layer 50. The process of forming the top mold structure may include a process of sequentially forming a first top mold layer 61, a first upper supporter layer 71a, a second top mold layer 63, and a second upper supporter layer 73a on the upper etch stop layer 50. The process of forming the top mold structure may be similar to the process of forming the bottom mold structure described above.

Figure 19:
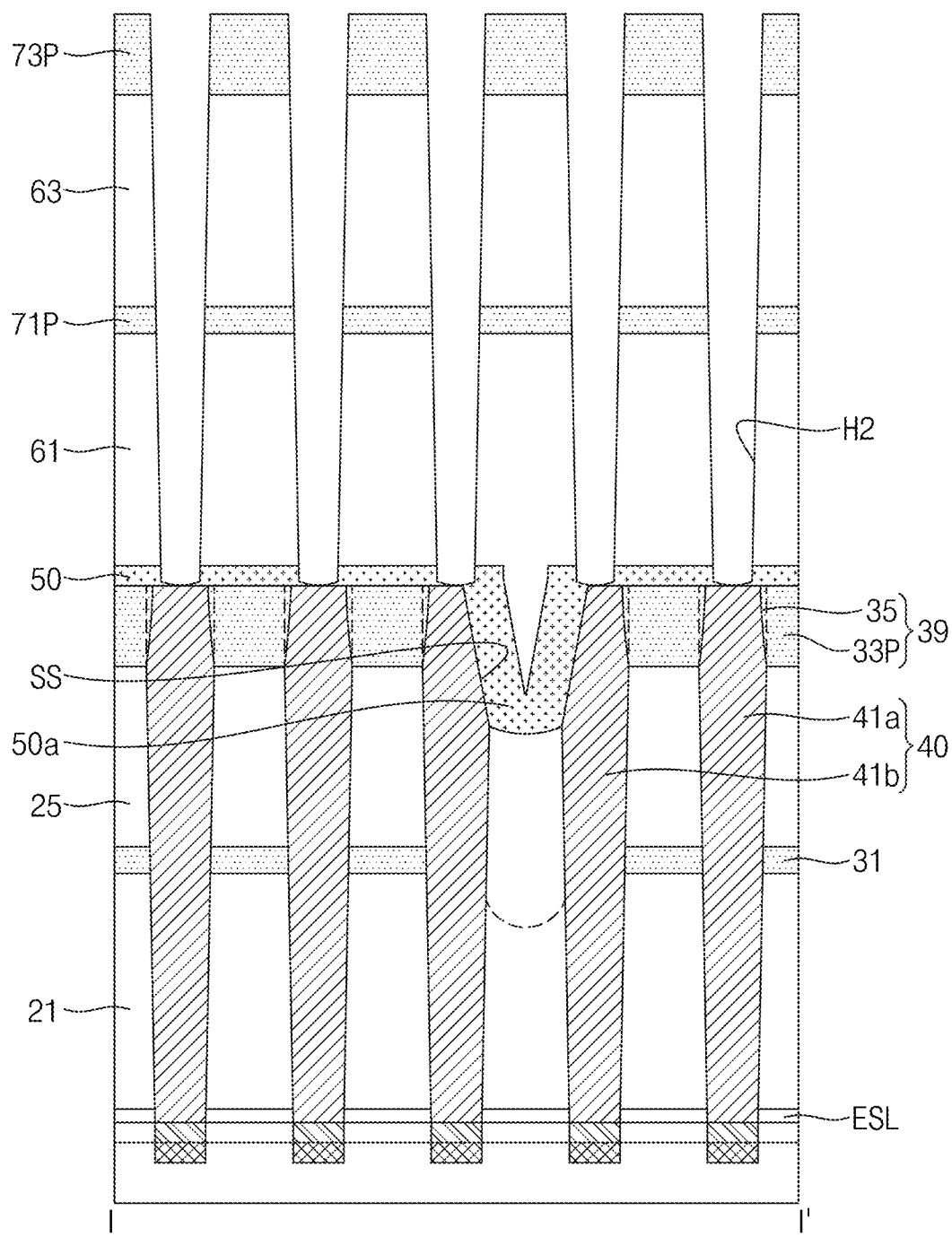

Referring to FIG. 19, the method may include a process of forming a top storage node electrode hole H2 passing through the top mold structure. The top storage node electrode hole H2 may pass through the first top mold layer 61, the first upper supporter layer 71a, the second top mold layer 63, the second upper supporter layer 73a, and the upper etch stop layer 50. The top storage node electrode hole H2 may expose the top surface of the bottom sub-electrode 40. The top storage node electrode hole H2 may be formed by an etch process using the upper etch stop layer 50 as an etch mask. As the top storage node electrode hole H2 is formed, a first preliminary upper supporter pattern 71P may be formed by patterning the first upper supporter layer 71a, and a second preliminary upper supporter pattern 73P may be formed by patterning the second upper supporter layer 73a.

The top storage node electrode hole H2 may be formed to vertically overlap the bottom sub-electrode 40. A center of the top storage node electrode hole H2 may be aligned with a center of the bottom sub-electrode 40. In an embodiment, the center of the top storage node electrode hole H2 may be misaligned with the center of the bottom sub-electrode 40.

An anisotropic etch process of forming the top storage node electrode hole H2 may use the upper etch stop layer 50 for stopping etching. A portion of the top surface of the upper etch stop layer 50 may be recessed by the anisotropic etch process.

Figure 20:
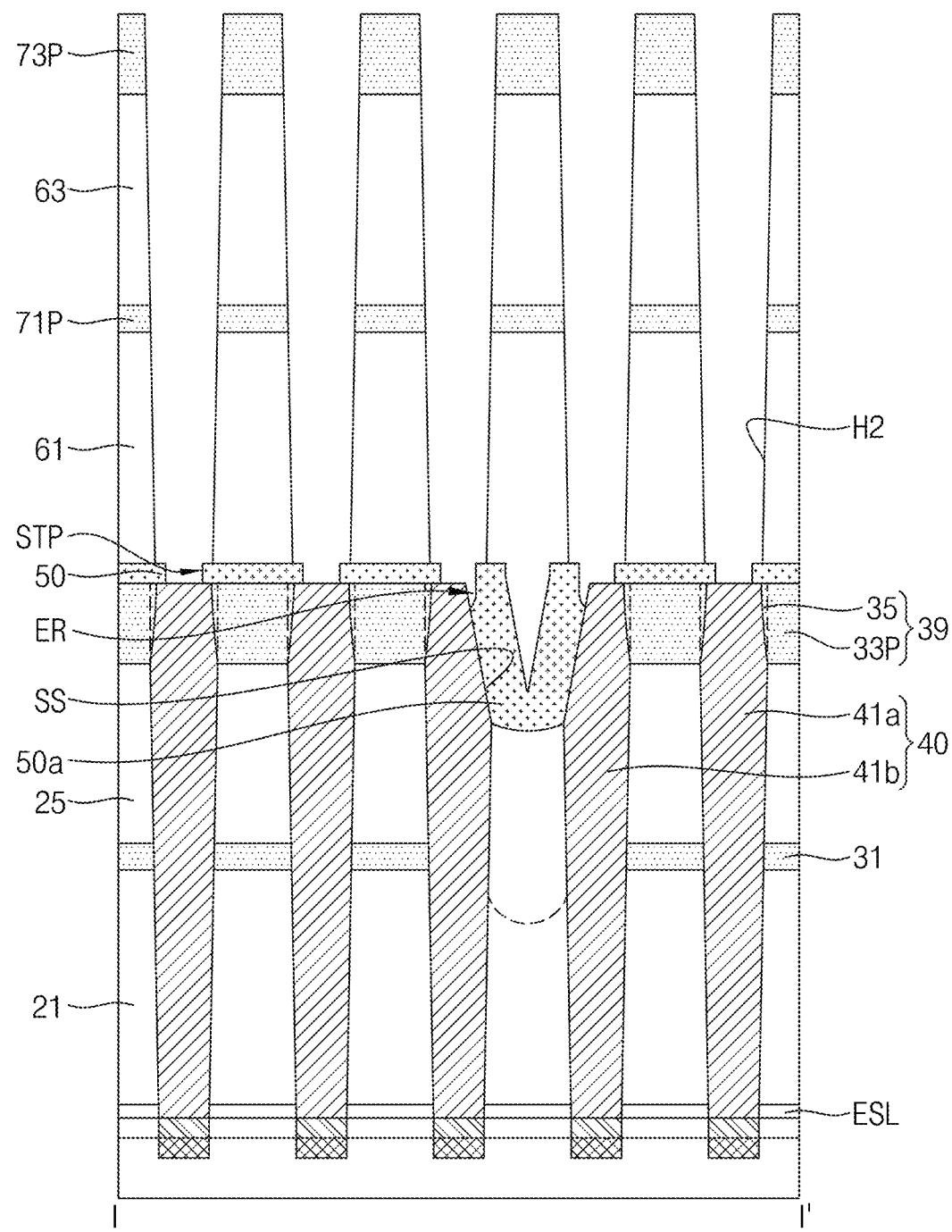

Referring to FIG. 20, the method may include a process of increasing a width of the top storage node electrode hole H2 to form a stepped portion STP. A portion of the top mold structure may be etched in a horizontal direction through a wet etch process using a diluted sulfuric acid peroxide (DSP) solution as an etchant, and thus, the width of the top storage node electrode hole H2 may increase. Since the upper etch stop layer 50 is lower in etching rate than the top mold structure with respect to the DSP solution, the upper etch stop layer 50 may be lower in etching amount than the first bottom mold layer 21 of the top mold structure. Therefore, the upper etch stop layer 50 may be formed in a shape which is offset with respect to an inner wall of the top storage node electrode hole H2 limited by the first bottom mold layer 21. Accordingly, the stepped portion STP having a stepped structure including the top surface of the upper etch stop layer 50 may be formed under the top storage node electrode hole H2.

In an embodiment, the top storage node electrode hole H2 may extend in a downward direction toward the filler part 50a of the upper etch stop layer 50 filling the opening portion OP. A portion of the filler part 50a adjacent to the inclined surface SS of the bottom sub-electrode 40 may be etched by the anisotropic etch process of etching the upper etch stop layer 50. Therefore, a portion of a bottom end of the top storage node electrode hole H2 may extend, and thus, an extension region ER which exposes the inclined surface SS of the bottom sub-electrode 40 and an outer surface of the filler part 50a may be formed. The extension region ER may have a shape where a vertical length thereof is greater than a horizontal width thereof. In an embodiment, a level of a bottom end of the extension region ER may be disposed to be higher than a level of a bottom surface of the second lower supporter pattern 39.

Figure 21:
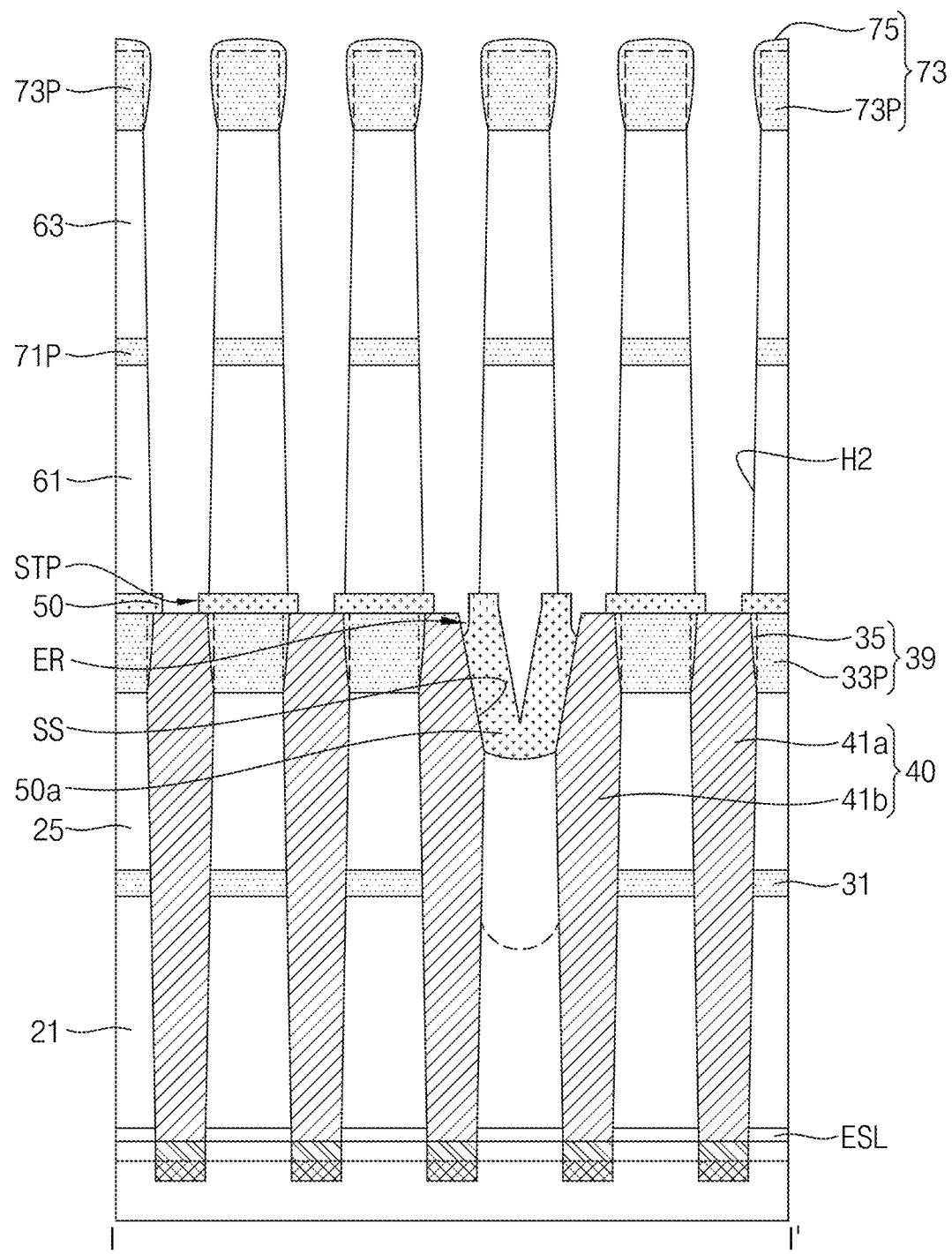

Referring to FIG. 21, the method may further include a process of forming a second preliminary upper supporter pattern 73 including an overhang. An upper capping layer 75 covering a surface of the second preliminary upper supporter pattern 73P may be formed, and thus, the second preliminary upper supporter pattern 73 including the overhang may be formed. A process of forming the upper capping layer 75 may be the same as or similar to the process of forming the lower capping layer 35. In an embodiment, the process of forming the upper capping layer 75 may be omitted.

Figure 22:
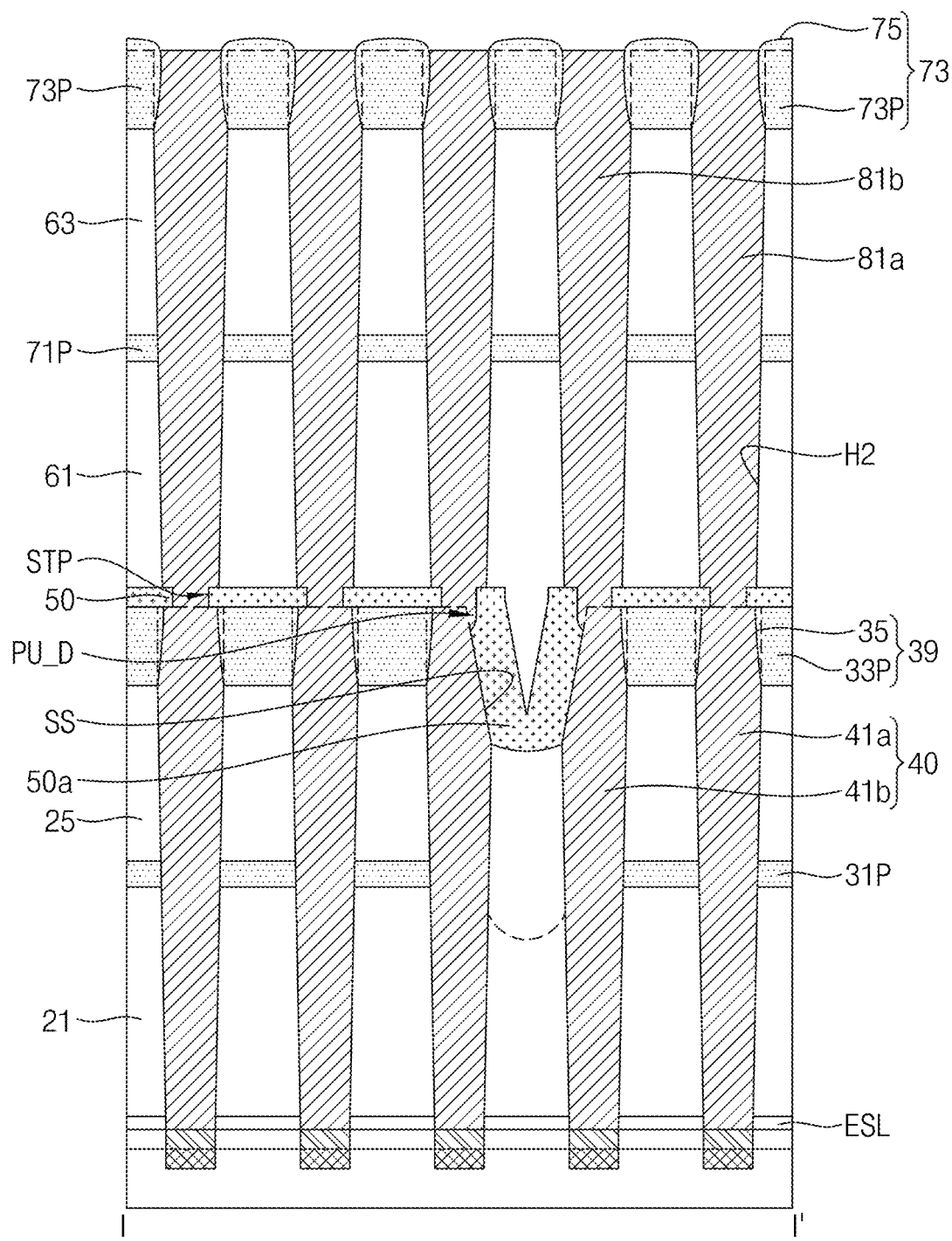

Referring to FIG. 22, the method may include a process of forming a top sub-electrode 80 filling the top storage node electrodes 40 and 80. The process of forming the top sub-electrode 80 may be the same as or similar to the process of forming the bottom sub-electrode 40 described above.

The top sub-electrode 80 may be formed along a profile of the stepped portion STP of the top storage node electrode hole H2 and may have a step ST having a stepped structure. The top sub-electrode 80 may be formed to include a downward protrusion portion PD_D filling the extension region ER of the top storage node electrode hole H2.

Figure 23:
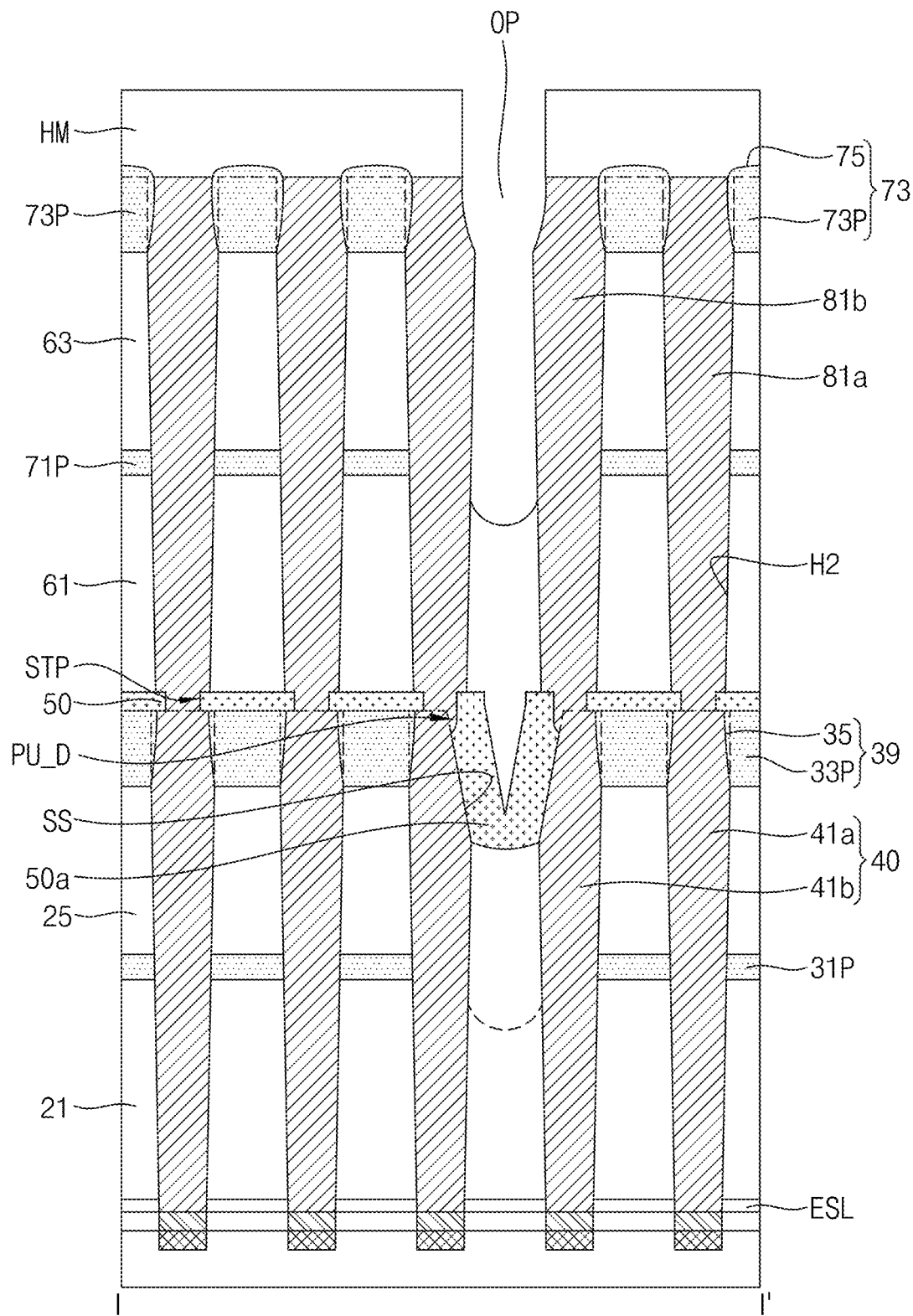

Referring to FIG. 23, the method may include a process of removing a portion of the second preliminary upper supporter pattern 73P to form a second upper supporter pattern 73 and an opening portion OP. The method may include a process of removing the second top mold layer 63 to form a cavity CV and etching a portion of the first preliminary upper supporter pattern 71P to form a first upper supporter pattern 71. A process of forming the second upper supporter pattern 73, the opening portion OP, the cavity CV, and the first upper supporter pattern 71 may be the same as or similar to a process of forming the second lower supporter pattern 39, the opening portion OP, the cavity CV, and the first lower supporter pattern 31 described above with reference to FIG. 13.

Figure 24:
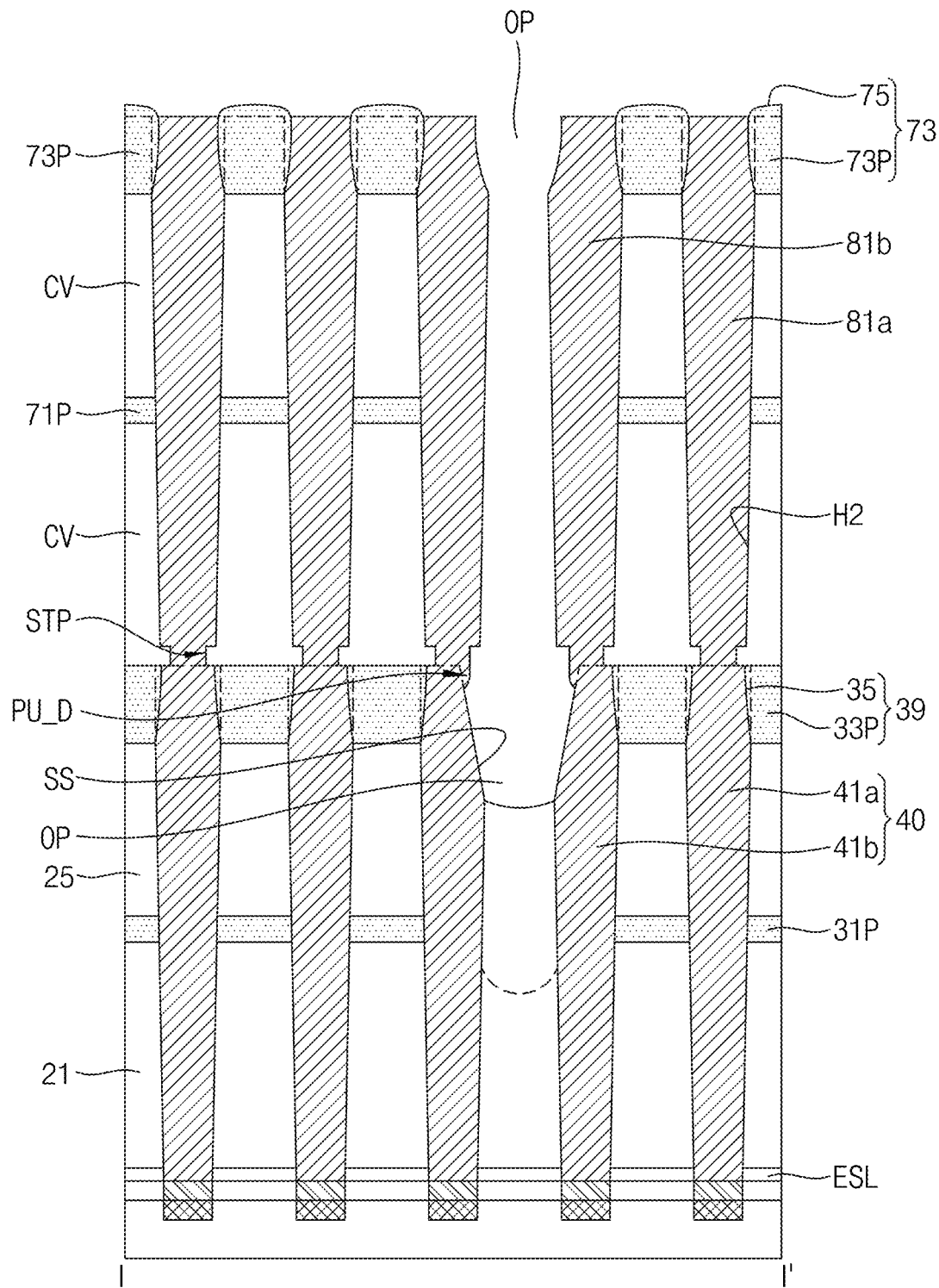

Referring to FIG. 24, the method may include a process of removing the first top mold layer 61 to form a cavity CV and removing the upper etch stop layer 50 to form an opening OP between bottom sub-electrodes 40. The first top mold layer 61 and the upper etch stop layer 50 may be removed by performing a wet etch process having etch selectivity on the lower supporter pattern 30, the upper supporter pattern 70, and the storage node electrodes 40 and 80. For example, the process of removing the first top mold layer 61 and the upper etch stop layer 50 may be an LAL lift-off process. At least a portion of the third bottom mold layer 25 may be removed together in the process of removing the upper etch stop layer 50. In an embodiment, the process of removing the upper etch stop layer 50 may be a radical dry cleaning process.

As the upper etch stop layer 50 is removed, the top surface of the second lower supporter pattern 39, the step ST of the top sub-electrode 80, and a portion of the top surface of the bottom sub-electrode 40 may be exposed. The filler part 50a of the upper etch stop layer 50 may be removed, and thus, the opening portion OP of the second lower supporter pattern 39 may be opened again. The side surface of the downward protrusion portion PU_D of the top sub-electrode 80, the inclined surface SS of the bottom sub-electrode 40, and the top surface of the third bottom mold layer 25 may be exposed through the opening portion OP. Subsequently, the method may include a process of removing the third bottom mold layer 25 and the first bottom mold layer 21 through the opening portion OP.

Figure 25:
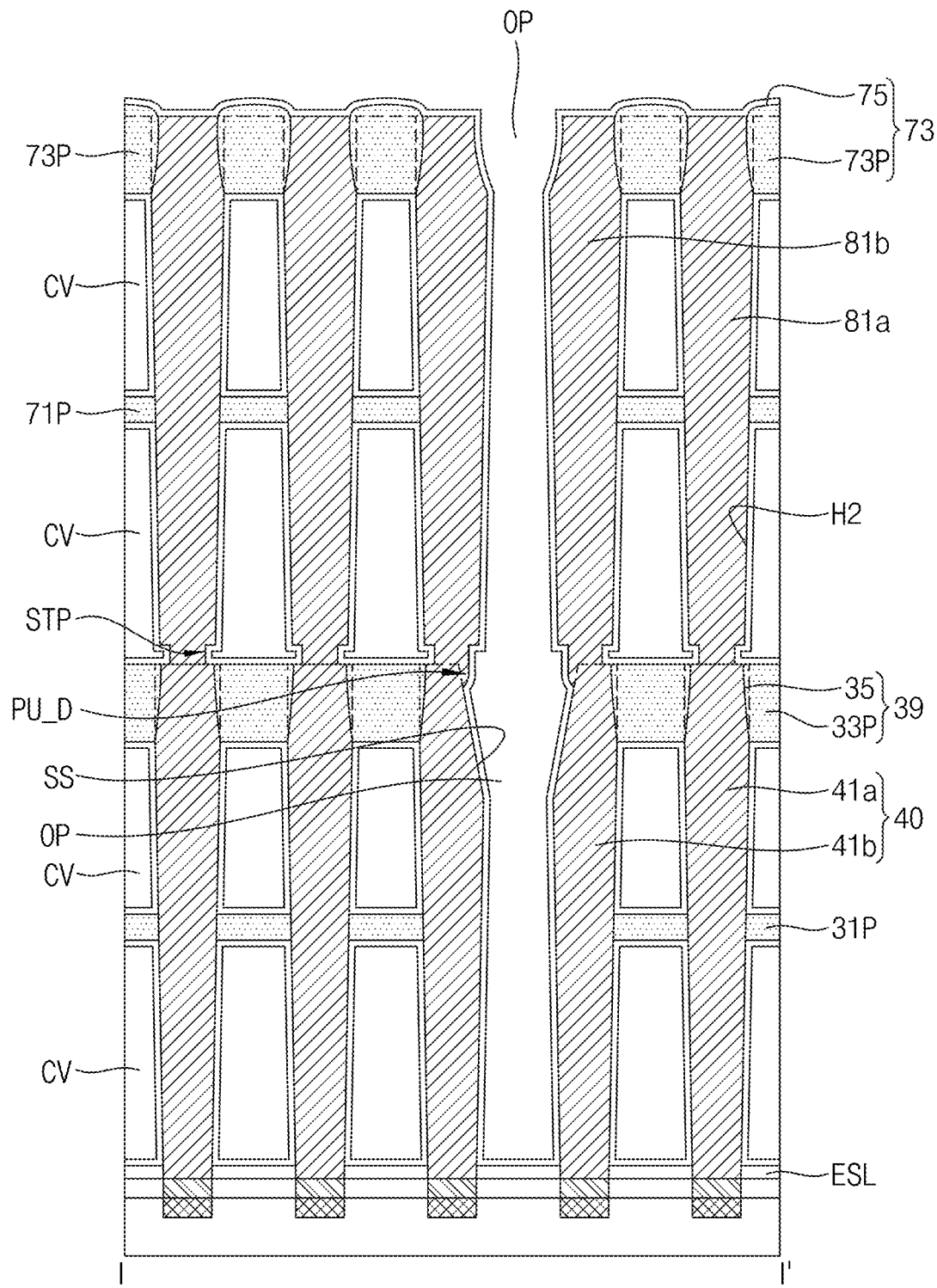

Referring to FIG. 25, the method may include a process of forming a dielectric layer 90. The dielectric layer 90 may be formed to conformally cover surfaces of the bottom sub-electrode 40, the top sub-electrode 80, the first lower supporter pattern 31, the second lower supporter pattern 39, the first upper supporter pattern 71, and the second upper supporter pattern 73, which are exposed through the opening portion OP and the cavity CV. For example, the dielectric layer 90 may include at least one of metal oxides such as hafnium oxide ($Hf_xO_y$), aluminium oxide ($Al_xO_y$), titanium oxide (Ti$_x$O$_y$), tantalum oxide (Ta$_x$O$_y$), ruthenium oxide (Ru$_x$O$_y$), lanthanum oxide (La$_x$O$_y$), or zirconium oxide (ZrO$_2$), a dielectric material having a perovskite structure such as SrTiO$_3$(STO), (Ba, Sr)TiO$_3$(BST), BaTiO$_3$, lead zirconate titanate (PZT), lead lanthanum zirconium titanate (PLZT), silicon oxide, and silicon nitride. The dielectric layer 90 may be formed by using a process such as a CVD process, a PVD process, or an ALD process, where step coverage is good.

Referring again to FIG. 2, the method may include a process of forming a plate electrode 100, filling the cavity CV and the opening portion OP, on the dielectric layer 90. The plate electrode 100 may include a bottom plate electrode 101 and a top plate electrode 103. The bottom plate electrode 101 may be formed on the dielectric layer 90. The bottom plate electrode 101 may conformally cover the dielectric layer 90. Even after the bottom plate electrode 101 is formed, a spare space may remain in each of the cavity CV and the opening portion OP. For example, the bottom plate electrode 101 may include the same material as that of the top sub-electrode 80 or the bottom sub-electrode 40. The top plate electrode 103 may cover the bottom plate electrode 101, on the bottom plate electrode 101. The top plate electrode 103 may fill the spare space of each of the cavity CV and the opening portion OP. For example, the top plate electrode 103 may include SiGe. In an embodiment, the plate electrode 100 may be a single layer. For example, the plate electrode 100 formed of a single layer may include a refractory metal material such as SiGe, cobalt (Co), titanium (Ti), nickel (Ni), tungsten (W), or a molybdenum (Mo). The plate electrode 100 may include at least one of metal nitrides such as TiN, TiAlN, and WN.

According to the embodiments, by using an etch stop layer, the semiconductor device may limit and/or prevent a profile defect from occurring in a top storage node electrode. Also, the semiconductor device may use the etch stop layer in a process of removing a step height of a mold layer of a peri region and a cell region, and thus, may limit and/or prevent the height loss of a storage node electrode, thereby providing a storage node electrode having a high aspect ratio. The semiconductor device may provide the top storage node electrode including a step, and thus, even when misalignment between the top storage node electrode and a bottom storage node electrode occurs, a profile defect and a defective connection may not occur, thereby improving reliability.

While embodiments of inventive concepts have been described with reference to the accompanying drawings, it should be understood by those skilled in the art that various modifications may be made without departing from the scope of inventive concepts and without changing essential features thereof. Therefore, the above-described embodiments should be considered in a descriptive sense only and not for purposes of limitation.

What is claimed is:

1. A semiconductor device comprising:
a substrate;
a bottom sub-electrode on the substrate, a region of the bottom sub-electrode including a recess;
a top sub-electrode on the bottom sub-electrode,
the top sub-electrode including a step extending from a side surface thereof,
the step of the top sub-electrode being adjacent to the bottom sub-electrode and to an inner portion of the top sub-electrode,
the top sub-electrode including a lower portion at a level lower than the step of the top sub-electrode and an upper portion at a level higher than the step of the top sub-electrode,
a maximum width of the lower portion of the top sub-electrode being narrower than a minimum width of the upper portion of the top sub-electrode,
the maximum width of the lower portion of the top sub-electrode being narrower than a width of a top end of the bottom sub-electrode, and
the top sub-electrode being adjacent to the region of the bottom sub-electrode including the recess;
a dielectric layer covering the bottom sub-electrode and the top sub-electrode; and
a plate electrode on the dielectric layer.

2. The semiconductor device of claim 1, wherein the recess in the region of the bottom sub-electrode has a concave shape.

3. The semiconductor device of claim 1, wherein
the region of the bottom sub-electrode has a trapezoidal shape, and
a width thereof is progressively narrowed in an upward direction.

4. The semiconductor device of claim 1, further comprising:
a lower supporter pattern contacting a side surface of the bottom sub-electrode; and
an upper supporter pattern contacting a side surface of the top sub-electrode.

5. The semiconductor device of claim 4, wherein
the lower supporter pattern includes a round side surface contacting the recess in the region of the bottom sub-electrode.

6. The semiconductor device of claim 4, wherein the lower supporter pattern further includes an overhang vertically overlapping the bottom sub-electrode.

7. The semiconductor device of claim 4, wherein the top sub-electrode contacts a top surface of the bottom sub-electrode and a top surface of the lower supporter pattern.

8. The semiconductor device of claim 1, wherein
the top sub-electrode further includes a downward protrusion between an inclined surface of the bottom sub-electrode and the dielectric layer, and
the downward protrusion of the top sub-electrode extends in a downward direction from a bottom end thereof.

9. The semiconductor device of claim 1, wherein the plate electrode further includes:
a bottom plate electrode covering the dielectric layer; and
a top plate electrode covering the bottom plate electrode.

10. The semiconductor device of claim 9, wherein the bottom plate electrode further includes a side protrusion portion extending toward the top sub-electrode.

11. The semiconductor device of claim 1, wherein the bottom sub-electrode has a pillar or cylindrical shape.

12. The semiconductor device of claim 11, wherein the top sub-electrode has a pillar or cylindrical shape.

13. A semiconductor device comprising:
a substrate;
a storage node electrode on the substrate,
the storage node electrode including a bottom sub-electrode and a top sub-electrode on the bottom sub-electrode,
the top sub-electrode including a step in a side surface thereof adjacent to the bottom sub-electrode, and
the bottom sub-electrode including a recess in a side surface thereof adjacent to the top sub-electrode;

a dielectric layer covering a surface of the storage node electrode;

a plate electrode on the dielectric layer; and a supporter pattern covering a portion of a side surface of the storage node electrode, the supporter pattern including a lower supporter pattern contacting the recess of the bottom sub-electrode.

14. The semiconductor device of claim 13, wherein a top surface of the bottom sub-electrode and a top surface of the lower supporter pattern are coplanar.

15. The semiconductor device of claim 13, wherein the bottom sub-electrode includes:

an external bottom sub-electrode including the recess; and an internal bottom sub-electrode including an inclined surface.

16. The semiconductor device of claim 15, wherein the top sub-electrode includes:

an external top sub-electrode on the external bottom sub-electrode; and an internal top sub-electrode on the internal bottom sub-electrode, the internal top sub-electrode including a downward protrusion portion covering a portion of the inclined surface.

\* \* \* \* \*